US007579868B2

(12) United States Patent
Kaptanoglu

(10) Patent No.: US 7,579,868 B2
(45) Date of Patent: *Aug. 25, 2009

(54) ARCHITECTURE FOR ROUTING RESOURCES IN A FIELD PROGRAMMABLE GATE ARRAY

(75) Inventor: Sinan Kaptanoglu, Belmont, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/843,575

(22) Filed: Aug. 22, 2007

(65) Prior Publication Data

US 2007/0285126 A1    Dec. 13, 2007

Related U.S. Application Data

(63) Continuation of application No. 11/202,686, filed on Aug. 12, 2005, now Pat. No. 7,279,930, which is a continuation of application No. 10/429,003, filed on Apr. 30, 2003, now Pat. No. 6,934,927, which is a continuation of application No. 09/519,312, filed on Mar. 6, 2000, now Pat. No. 6,636,930.

(51) Int. Cl.
*H01L 25/00* (2006.01)
(52) U.S. Cl. .......................................... 326/41; 326/47
(58) Field of Classification Search .............. 326/37–41, 326/47
See application file for complete search history.

(56) References Cited

U.S. PATENT DOCUMENTS 5,204,556 A * 4/1993 Shankar ...................... 326/41
5,424,589 A * 6/1995 Dobbelaere et al. ........... 326/41
5,485,104 A    1/1996 Agrawal et al.
5,509,128 A    4/1996 Chan
5,537,057 A * 7/1996 Leong et al. .................. 326/41
5,541,530 A    7/1996 Cliff et al.
5,598,109 A * 1/1997 Leong et al. .................. 326/41
5,625,301 A * 4/1997 Plants et al. .................. 326/41

(Continued)

OTHER PUBLICATIONS

Lai et al., "Hierarchical Interconnection Structures for Field Programmable Gate Arrays", IEEE Transactions on Very Large Scale Integration (VLSI) Systems, vol. 5, No. 2, pp. 186-196, Jun. 1997.

(Continued)

*Primary Examiner*—Vibol Tan
*Assistant Examiner*—Jason Crawford
(74) *Attorney, Agent, or Firm*—Lewis and Roca LLP

(57) ABSTRACT

A turning structure for routing channels in a field programmable gate array, comprising a first plurality of routing channels having a first direction and a second plurality of routing channels having a second direction. The first plurality of routing channels intersects the second plurality of routing channels to form a plurality of matrices of intersecting interconnect conductors in the routing channels. A first number of reprogrammable elements is disposed at intersections in at least one of the plurality of matrices, a second number of reprogrammable elements disposed at intersections in at least one of the plurality of matrices. The second number of reprogrammable elements is greater than the first number of reprogrammable elements, and a third number of reprogrammable elements disposed at intersections in at least one of the plurality of matrices. The third number of reprogrammable elements is greater than the second number of reprogrammable elements.

21 Claims, 21 Drawing Sheets

U.S. PATENT DOCUMENTS

| | | | |
|---|---|---|---|
| 5,671,432 A | 9/1997 | Bertolet et al. | |
| 5,815,004 A | 9/1998 | Trimberger et al. | |
| 5,818,254 A | 10/1998 | Agrawal et al. | |
| 5,872,380 A | 2/1999 | Rostoker et al. | |
| 5,982,195 A | 11/1999 | Cliff et al. | |
| 6,002,268 A | 12/1999 | Sasaki et al. | |
| 6,005,410 A | 12/1999 | Laramie | |
| 6,038,627 A | 3/2000 | Plants | |
| 6,049,224 A | 4/2000 | Britton et al. | |
| 6,049,225 A | 4/2000 | Huang et al. | |
| 6,051,991 A * | 4/2000 | Ting | 326/41 |
| 6,130,551 A * | 10/2000 | Agrawal et al. | 326/39 |
| 6,154,051 A * | 11/2000 | Nguyen et al. | 326/41 |
| 6,191,611 B1 * | 2/2001 | Altaf | 326/39 |
| 6,205,533 B1 | 3/2001 | Margolus | |
| 6,216,252 B1 | 4/2001 | Dangelo et al. | |
| 6,256,769 B1 | 7/2001 | Tamarkin et al. | |
| 6,268,743 B1 | 7/2001 | Kaptanoglu | |
| 6,286,093 B1 | 9/2001 | Chang et al. | |
| 6,300,793 B1 | 10/2001 | Ting et al. | |
| 6,338,106 B1 | 1/2002 | Vorbach | |
| 6,396,304 B2 | 5/2002 | Cliff et al. | |
| 6,415,425 B1 | 7/2002 | Chaudhary et al. | |
| 6,507,216 B1 | 1/2003 | Lane et al. | |
| 6,510,544 B1 | 1/2003 | Matsumoto et al. | |
| 6,526,556 B1 | 2/2003 | Stoica et al. | |
| 6,567,968 B1 | 5/2003 | Kaptanoglu | |
| 6,577,160 B2 | 6/2003 | Reddy et al. | |
| 6,636,930 B1 | 10/2003 | Kaptanoglu | |
| 6,670,825 B1 | 12/2003 | Lane et al. | |
| 6,727,727 B2 | 4/2004 | Schleicher et al. | |
| 6,798,242 B2 | 9/2004 | Reddy et al. | |
| 6,934,927 B2 | 8/2005 | Kaptanoglu | |
| 7,279,930 B2 * | 10/2007 | Kaptanoglu | 326/41 |
| 2001/0043083 A1 | 11/2001 | Cliff et al. | |

OTHER PUBLICATIONS

D. Bursky, "Variable-Grain Architecture Pumps Up FPGA Performance", Electronic Design, vol. 46, No. 4, pp. 102, 104, 106, Feb. 23, 1998.

U.S. Appl. No. 09/519,082, filed Mar. 6, 2000 entitled High Level Roting Architecture in a Field Programmable Gate Array and abandoned.

* cited by examiner

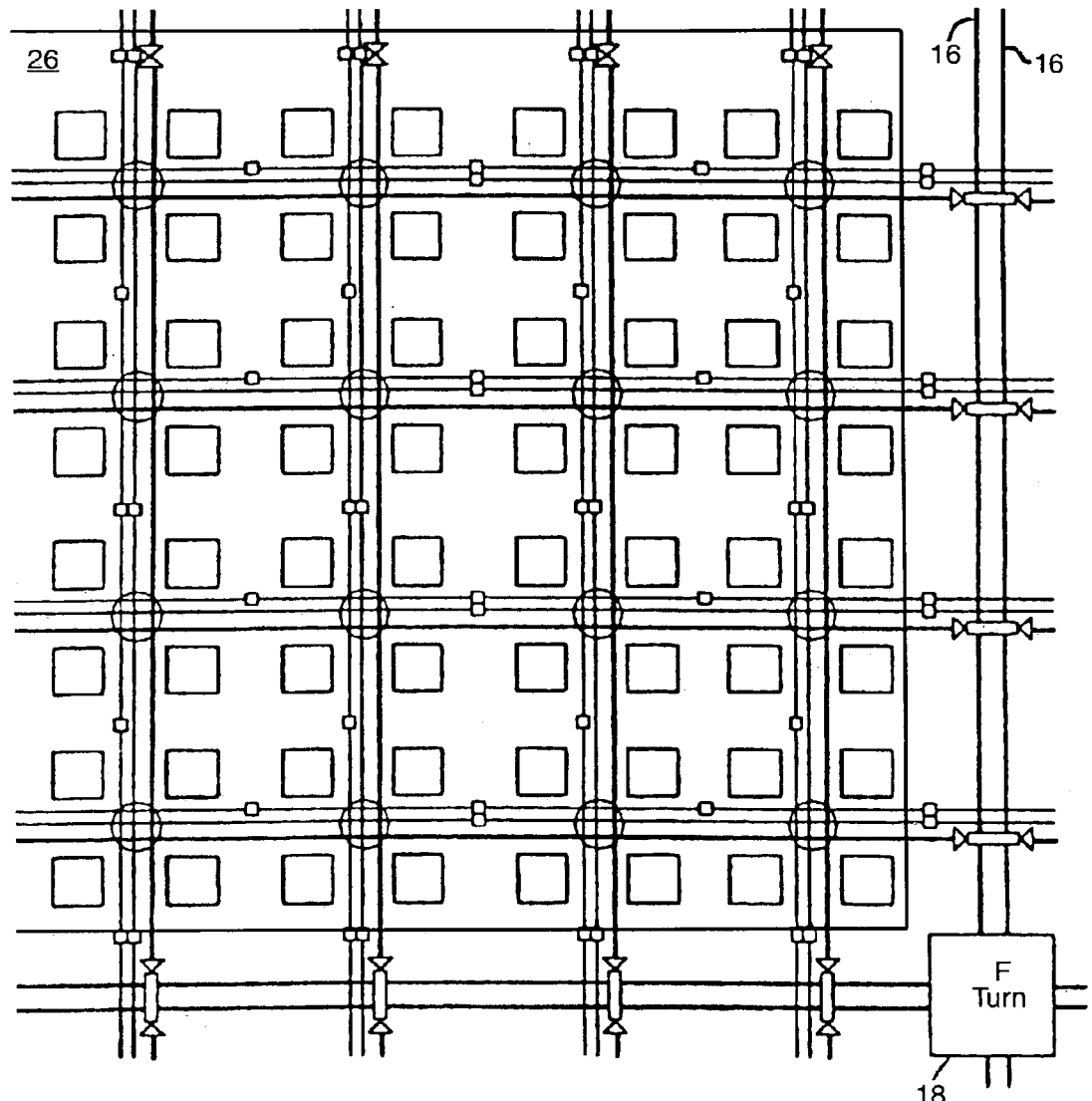
FIG. 2 4 of 4

ARCHITECTURE FOR ROUTING RESOURCES IN A FIELD PROGRAMMABLE GATE ARRAY

CROSS-REFERENCE TO RELATED APPLICATIONS

This application is a continuation of U.S. patent application Ser. No. 11/202,686, filed Aug. 12, 2005, now issued as U.S. Pat. No. 7,279,930, which is a continuation of U.S. patent application Ser. No. 10/429,003, filed Apr. 30, 2003, now issued as U.S. Pat. No. 6,934,927, which is a continuation of U.S. patent application Ser. No. 09/519,312, filed Mar. 6, 2000, now issued as U.S. Pat. No. 6,636,930.

BACKGROUND OF THE INVENTION

1. Field of the Invention

The present invention relates to a field programmable gate array (FPGA) architecture. More particularly, the present invention relates to structures for coupling routing resources to one another in an FPGA architecture.

2. The Background Art

In the FPGA art, both antifuse based programmable architectures and SRAM based reprogrammable architectures are well known. In an FPGA, the logic elements in the gate array are connected together by routing resources to form a desired integrated circuit. The routing resources are connected to each other and to the logic elements in the gate array by programmable elements. In a antifuse based device, the number of the programmable elements far exceeds the number of elements in an SRAM based device because the area required for an antifuse is much smaller than an SRAM bit. Despite this space disadvantage of an SRAM based device, SRAM based devices are implemented because they are reprogrammable, whereas an antifuse device is presently one-time programmable.

Due to the area required for an SRAM bit, a reprogrammable SRAM bit cannot be provided to connect routing resources to each other and tile logic elements at every desired location. The selection of only a limited number of locations for connecting the routing resources with one another and the logic elements is termed "depopulation". Because the capability to place and route a wide variety of circuits in an FPGA depends upon the availability of routing and logic resources, the selection of the locations at which the programmable elements should be made with great care.

Some of the difficulties faced in the place and route caused by depopulation may be alleviated by creating symmetries in the FPGA. For example, look-up tables (LUT) are often employed at the logic level in an SRAM based FPGA, because a LUT has perfect symmetry among its inputs.

The need for greater symmetry in a reprogrammable FPGA architecture does not end with the use of look-up tables. It also extends to the manner in which routing resources are connected together and the manner in which routing resources are connected to the logic elements. Without a high degree of symmetry in the architecture, the SRAM memory bit depopulation makes the place and route of nets in an SRAM based FPGA difficult.

It is therefore an object of the present invention to provide structures for connecting the routing resources in an FPGA to one another to improve the symmetry in the FPGA architecture.

BRIEF DESCRIPTION OF THE INVENTION

The present invention is directed to aspects of a semi-hierarchical architecture in an FPGA having top, middle and low levels. The FPGA architecture has structures for connecting the routing resources in the FPGA to one another and to the logic resources to improve the symmetry of the FPGA architecture and thereby increase the place and routability of an FPGA.

The top level of the architecture is an array of the B 16×16 tiles arranged in a rectangular array and enclosed by I/O blocks on the periphery. On each of the four sides of a B 16×16 tile, and also associated with each of the I/O blocks is a freeway routing channel. The width freeway routing channel in the rectangular array can be changed to accommodate different numbers of B 16×16 tiles without disturbing the internal structure of the B 16×16 tiles. The freeway routing channels can be extended in any combination of directions at each end by a freeway turn matrix (F-turn).

A B 16×16 tile in the middle level of hierarchy is a sixteen by sixteen array of B1 blocks. The B 16×16 tile is a nesting of a B2×2 tile that includes a two by two array of four B1 blocks. The B2×2 tiles are stepped into a four by four array of sixteen B1 blocks in a B4×4 tile, and the B4×4 tiles are stepped into an eight by eight array of sixty-four B 1 blocks in a B8×8 tile. A B16×16 tile includes four B8×8 tiles.

The routing resources in the middle level of hierarchy are expressway routing channels M1, M2, and M3 including groups of interconnect conductors. The expressway routing channels M1, M2, and M3 are segmented, and between each of the segments in the expressway routing channels M1, M2, and M3 are disposed extensions that can extend the expressway routing channel M1, M2, or M3 an identical distance along the same direction. The segments of an M3 expressway routing channel is extended at the boundary of a B1 6×16 tile where an expressway routing channel M3 crosses a freeway routing channel by an F-tab, and otherwise by an M3 extension.

The expressway routing channels M1, M2, and M3 run both vertically through every column and horizontally through every row of B2×2 tiles. At the intersections of each of the expressway routing channels M1, M2, and M3 in the horizontal direction with the expressway routing channels M1, M2 and M3 in the vertical direction is an expressway turn (E-turn) disposed at the center of each B2×2 tile.

An E-turn is a passive device that includes a matrix of reprogrammable switches. The reprogrammable switches are preferably a pass device controlled by an SRAM bit. The interconnect conductors in the expressway routing channels M1, M2 and M3 that are fed into an E-turn may be coupled to many of the other interconnect conductors in the expressway routing channels M1, M2 and M3 that come into the E-turn by the programmable switches. Further, the interconnect conductors in the expressway routing channels M1, M2 and M3 that are fed into an E-turn continue in the same direction through the E-turn, even though the interconnect conductors are coupled to other interconnect conductors by the reprogrammable switches.

At the lowest level of the semi-hierarchical FPGA architecture, there are block connect (BC) routing channels, local mesh (LM) routing channels, and direct connect (DC) interconnect conductors.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

The present invention is directed to aspects of a semi-hierarchical architecture implemented in an FPGA having top, middle and low levels. In a semi-hierarchical architecture according to the present invention, the three levels of the architecture may be coupled to one another as in a hierarchy or the routing resources in each of the three levels may be extended to similar architectural groups in the same level of the architecture. The semi-hierarchical nature of the FPGA architecture according to the present invention significantly improves the place and route of nets or circuits in the lowest level of the architecture and in the connection of these nets to higher levels in the semi-hierarchical architecture. To better understand the present invention, a description of the three levels of the semi-hierarchical architecture is made herein.

Figure 1:
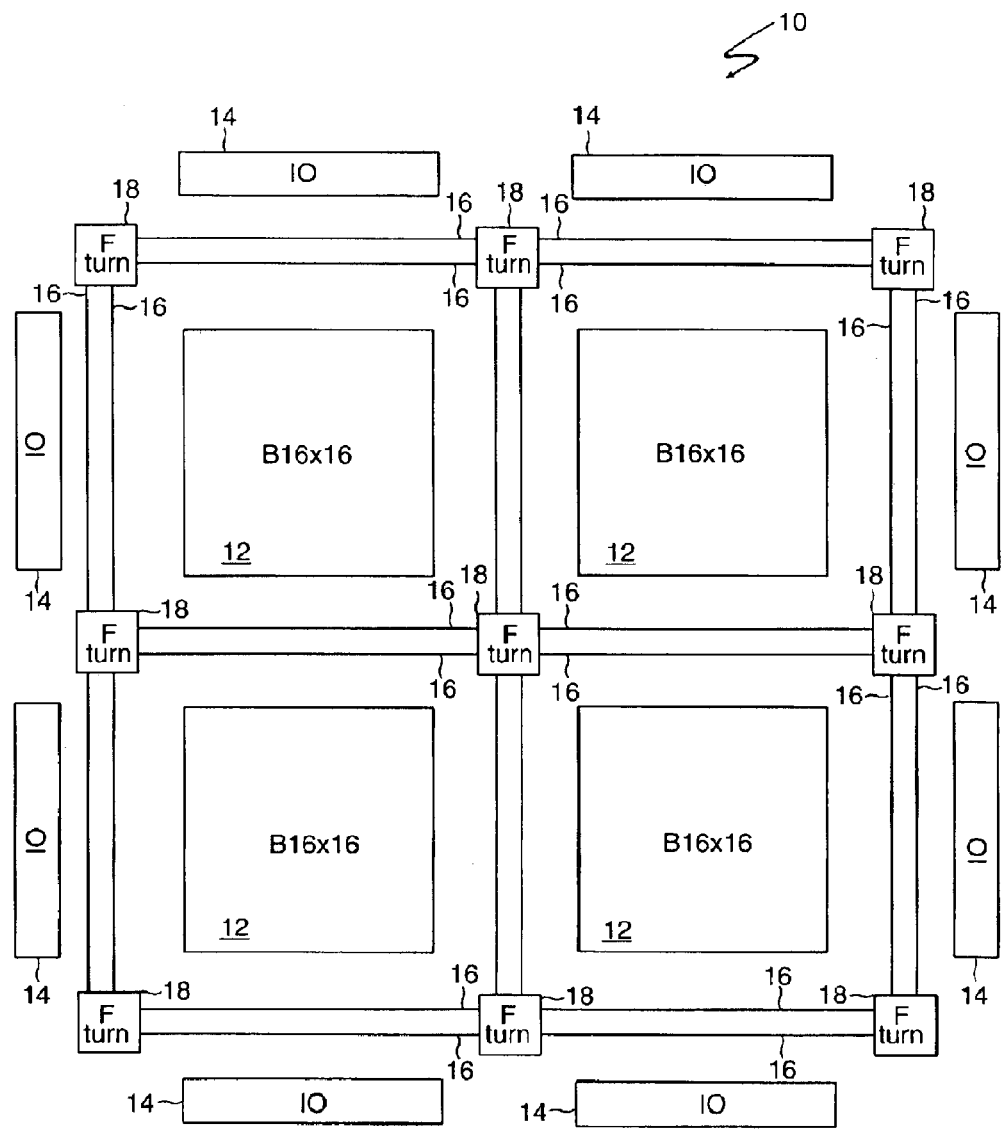
FIG. 1 is a block diagram of the floor plan of an FPGA including the top level of a semi-hierarchical architecture according to the present invention.

Turning now to FIG. 1 a block diagram of the floor plan of an FPGA 10 according to the present invention including the top level of the semi-hierarchical architecture is illustrated. The top level of the architecture is an array of the B 16×16 tiles 12 arranged in a rectangular array and enclosed by I/O blocks 14 on the periphery and the associated routing resources. A B 16×16 tile 12 is a sixteen by sixteen array of B1 blocks. As will be described in detail below, a B 16×16 tile 12 and its associated routing resources represent the middle level in the semi-hierarchical architecture, and a B1 block and its associated routing resources represents the lowest level in the semi-hierarchical architecture.

On each of the four sides of a B1 6×16 tile 12, and also associated with each of the I/O blocks 14 is freeway routing channel 16. The coupling of a freeway routing channel 16 to the routing resources in the middle level of the semi-hierarchical architecture will be described in greater detail below. From FIG. 1, it should be appreciated that on each side of a B 16×16 tile 12 there are two freeway routing channels 16, either as a result of the disposition of two freeway routing channels 16 between adjacent B 16×16 tiles 12 or as a result of the disposition of two freeway routing channels between a B 16×16 tile 12 and an adjacent I/O block 14.

It should be appreciated that the number of B 16×16 tiles 12 in the rectangular array may be fewer or greater than the four shown in FIG. 1.

According to the present invention, it is presently contemplated that the width of a freeway routing channel 16 in the rectangular array can be changed to accommodate different numbers of B 16×16 tiles 12 without disturbing the internal structure of the B 16×16 tiles 12. In this manner, the floorplan of the FPGA 10 can readily be custom sized by including the desired number of B 16×16 tiles 12 in the design.

The freeway routing channels 16 can be extended in any combination of directions at each end by a freeway mm matrix (F-turn) 18. An F-turn 18 is an active device that includes tri-state buffers and a matrix of reprogrammable switches. The reprogrammable switches are preferably pass devices controlled by a SRAM bit. The interconnect conductors in the freeway routing channels 16 that are fed into an F-turn 18 may be coupled to many of the other interconnect conductors in the freeway routing channels 16 that come into the F-turn 18 by the reprogrammable switches.

To avoid overcomplicating the disclosure and thereby obscuring the present invention an F-turn 18 is not described in detail herein. An implementation of an F-turn 18 suitable for use according to the present invention is disclosed in U.S. patent application Ser. No. 09/519,082, filed Mar. 6, 2000, now abandoned, and hereby incorporated by reference.

The freeway routing channels 16 along with the F-turns 18 form a course mesh. A freeway routing channel 16 will very rarely be utilized all by itself without any extension, since such distances are abundantly covered by the routing resources in the middle hierarchy to be described below. A freeway routing channel 16 is primarily intended to be used in conjunction with one or more other freeway routing channel 16 in any direction that together can span a distances of two or more B 16×16 tiles 12.

Figure 2:
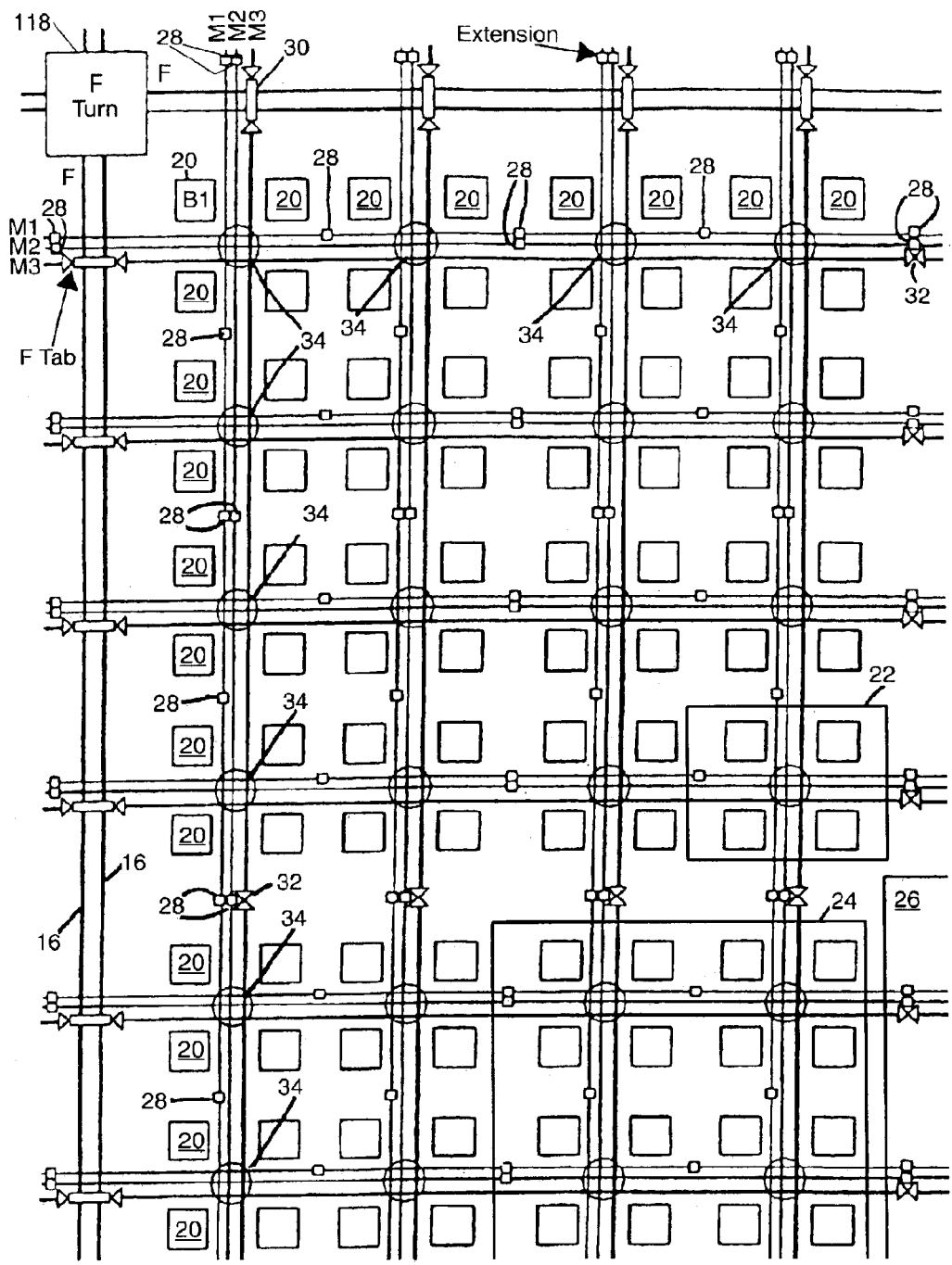
FIG. 2 is a block diagram of a B1 6×16 tile in an FPGA and the associated routing resources in the middle level of a semi-hierarchical architecture according to the present invention.
Figure 2:
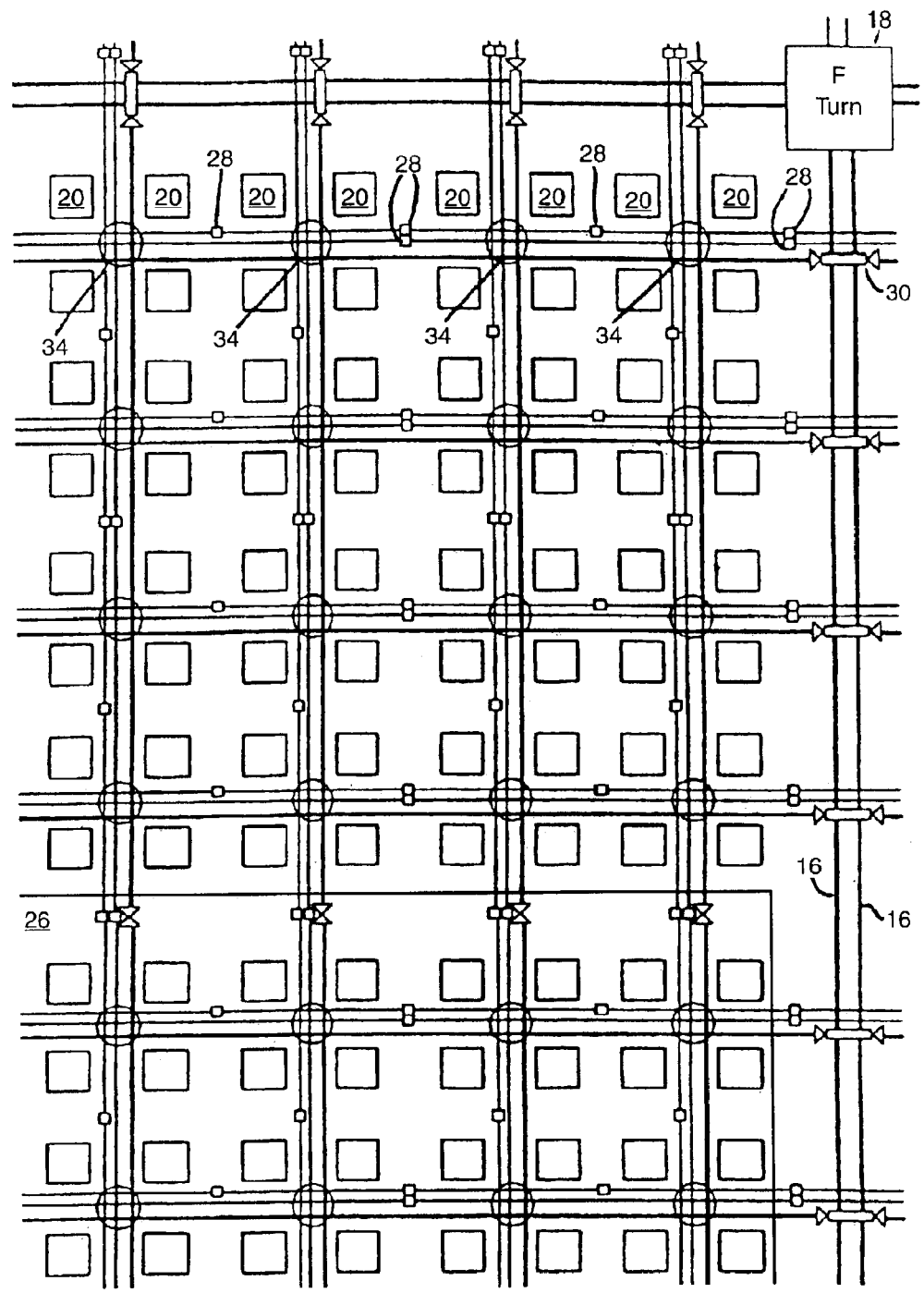
Figure 2:
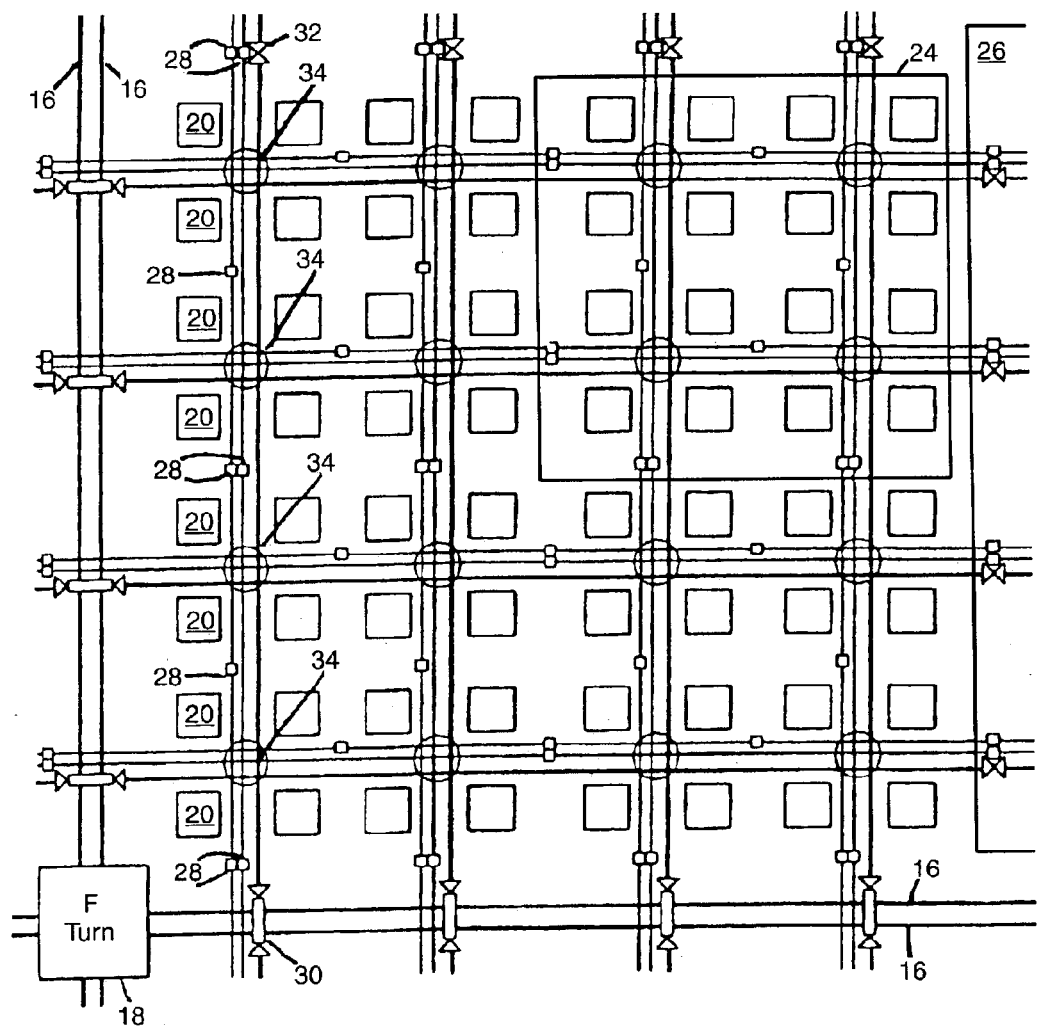

In FIG. 2, a block diagram of a B 16×16 tile 12 and the associated routing resources in the middle level of hierarchy is illustrated. The B 16×16 tile 12 is a sixteen by sixteen array of B1 blocks 20. To avoid overcomplicating the drawing figure, only the B1 blocks 20 in a single row and a single column are indicated by the reference numeral 20. The B 16×16 tile 12 is based on the repetition and nesting of smaller groupings (tiles) of B1 blocks 20. The smallest tile that is directly replicated and stepped is a B2×2 tile 22, which includes a two by two array of four B1 blocks 20. The B2×2 tiles 22 are stepped into a four by four array of sixteen B1 blocks 20 in a B4×4 tile 24, and the B4×4 tiles 24 are stepped into a eight by eight array of sixty-four B1 blocks 20 in a B8×8 tile 26. A B16×16 tile 12 includes four B8×8 tiles 26.

Though not depicted in FIG. 2, the B 16×16 tile 12 further includes a block of user assignable static random access memory (SRAM) disposed between the two upper B8×8 tiles 26, and a block of user assignable SRAM disposed between the two lower B8×8 tiles 26.

The routing resources in the middle level of hierarchy are termed expressway routing channels. There are three types of expressway routing channels, namely M1, M2, and M3. In FIG. 2, only a single row and a single column of expressway routing channels M1, M2, and M3 are denominated to avoid overcomplicating the drawing figure. In a preferred embodiment of the present invention, there is a single group of nine interconnect conductors in an M1 expressway routing channel, two groups of nine interconnect conductors in an M2 expressway routing channel, and six groups of nine interconnect conductors in an M3 expressway routing channel.

The expressway routing channels M1, M2, and M3 are segmented so that each expressway routing channel M1, M2, and M3 spans a distance of a B2×2 tile 22, a B4×4 tile 24, and a B8×8 tile 26, respectively. Between each of the segments in the expressway routing channels M1, M2, and M3 are disposed extensions that can extend the expressway routing channel M1, M2, or M3 an identical distance along the same direction.

The extensions 28 that couple the segments in the expressway routing channels M1 and M2 are passive reprogrammable elements that are preferably a pass device controlled by an SRAM bit. The extensions 28 provide a one-to-one coupling between the interconnect conductors of the expressway routing channels M1 and M2 on either side of the extensions 28. To avoid overcomplicating the drawing figure, only the extensions 28 in a single row and a single column are indicated by the reference numeral 28.

The segments of an M3 expressway routing channel is extended at the boundary of a B 16×16 tile 12 where an expressway routing channel M3 crosses a freeway routing channel 16 by a freeway tab (F-tab) 30, and otherwise by an M3 extension 32. To avoid overcomplicating the drawing figure, only the F-tabs 30, and M3 extensions 32 in a single row and a single column are indicated by the reference numeral 30 and 32, respectively.

An F-tab 30 is an active device that includes tri-state buffers and a matrix of reprogrammable switches. The reprogrammable switches are preferably a pass device controlled by an SRAM bit. The interconnect conductors in the freeway routing channels 16 and the expressway routing channel M3 that are fed into an F-tab 30 may be coupled to many of the other interconnect conductors in the freeway routing channels 16 and the expressway routing channel M3 that come into the F-tab 30 by the programmable switches. Further, the interconnect conductors in the freeway routing channels 16 and the expressway routing channel M3 that are fed into an F-tab 30 continue in the same direction through the F-tab 30, even though the interconnect conductors are coupled to other interconnect conductors by the reprogrammable switches.

Accordingly, an F-tab 30 implements the dual role of providing an extension of the middle level routing resources in a B1 6×16 tile 12 to the middle level routing resources in an adjacent B 16×16 tile 12 and providing access between the middle level routing resources of B 16×16 tile 12 and a freeway routing channel 16 in the highest level of the architecture. An F-tab 30 can combine the two roles of access and extension simultaneously in the formation of a single net.

To avoid overcomplicating the disclosure and thereby obscuring the present invention an F-tab 30 is not described in detail herein. An implementation of an F-tab 30 suitable for use according to the present invention is disclosed in U.S. patent application Ser. No. 09/519,082, filed Mar. 6, 2000, now abandoned, and hereby incorporated by reference.

An M3 extension 32 is an active device that includes tristatable buffers coupled to a matrix of reprogrammable switches. The reprogrammable switches are preferably a pass device controlled by an SRAM bit. The interconnect conductors in the expressway routing channel M3 that are fed into an M3 extension 32 may be coupled by the reprogrammable switches to many of the other interconnect conductors in the expressway routing channel M3 that come into the M3 extension 32. An M3 extension 32 according to a preferred embodiment of the present invention is described in greater detail below.

To avoid overcomplicating the disclosure and thereby obscuring the present invention an M3 extension 32 is not described in detail herein. An implementation of an M3 extension 32 suitable for use according to the present is disclosed in U.S. patent application Ser. No. 09/519,082, now abandoned, filed Mar. 6, 2000, and hereby incorporated by reference.

As depicted in FIG. 2, all of the expressway routing channels M1, M2, and M3 run both vertically through every column and horizontally through every row of B2×2 tiles 22. At the intersections of each of the expressway routing channels M1, M2, and M3 in the horizontal direction with the expressway routing channels M1, M2 and M3 in the vertical direction is an expressway turn (E-turn) 34 disposed at the center of each B2×2 tile 22. To avoid overcomplicating the drawing figure, only the E-turns 34 disposed in the B2×2 tiles 22 in a single row and a single column are indicated by the reference numeral 34.

An E-turn 34 is a passive device that includes a matrix of reprogrammable switches. The reprogrammable switches are preferably a pass device controlled by an SRAM bit. The interconnect conductors in the expressway routing channels M1, M2 and M3 that are fed into an E-turn 34 may be coupled to many of the other interconnect conductors in the expressway routing channels M1, M2 and M3 that come into the E-turn 30 by the programmable switches. Further, the interconnect conductors in the expressway routing channels M1, M2 and M3 that are fed into an E-turn 34 continue in the same direction through the E-turn 34, even though the interconnect conductors are coupled to other interconnect conductors by the reprogrammable switches. An E-turn 34 according to the present invention is described in greater detail below.

Figure 3:
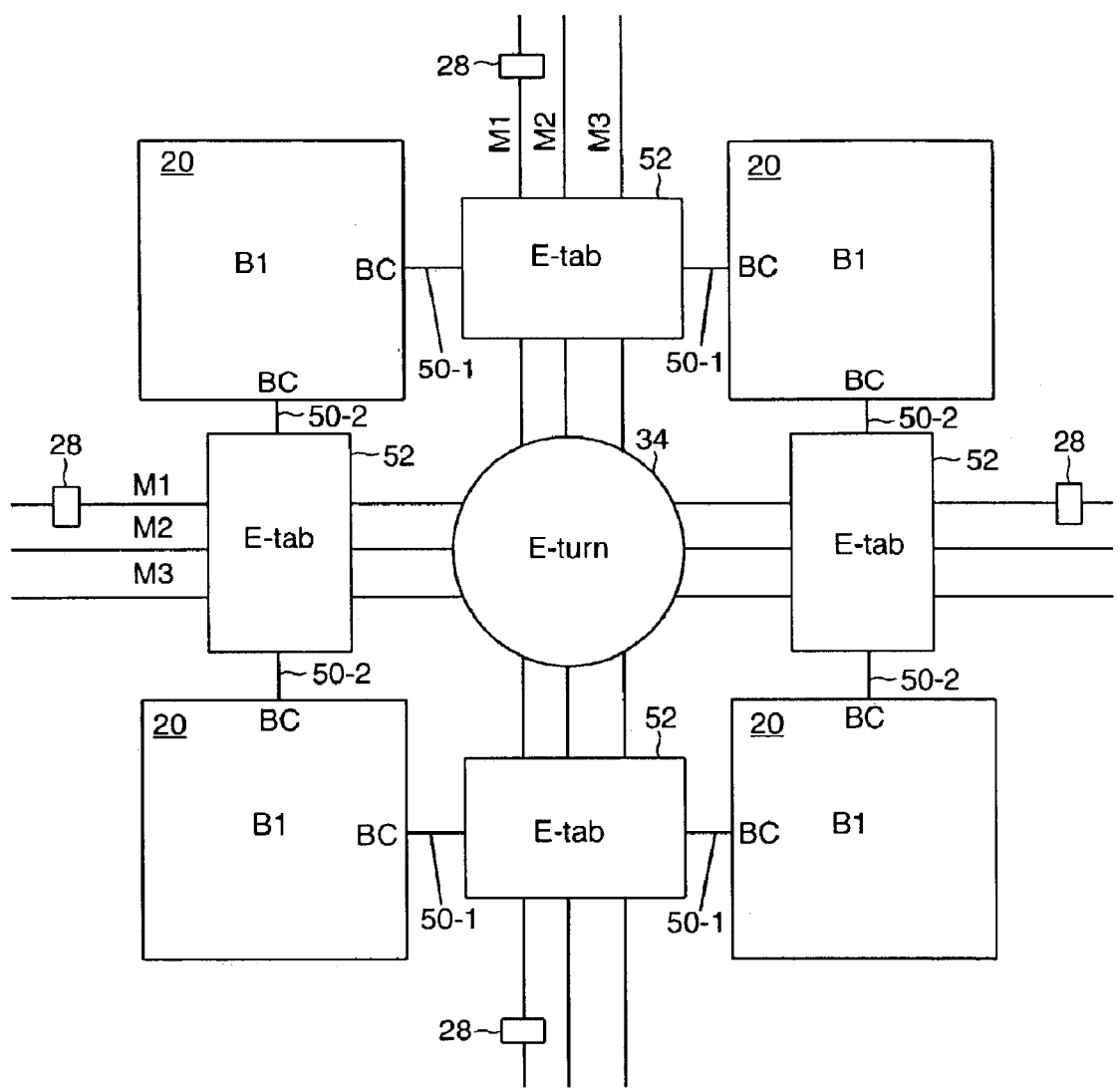
FIG. 3 is a block diagram of a B2×2 tile in an FPGA and the connection of the routing resources in the lowest level to the middle level of a semi-hierarchical architecture according to the present invention.

At the lowest level of the semi-hierarchical FPGA architecture, there are three types of routing resources, block connect (BC) routing channels, local mesh (LM) routing channels, and direct connect (DC) interconnect conductors. According to a preferred embodiment of the present invention, there are nine interconnect conductors in each BC routing channel and six interconnect conductors in each LM routing channel. Of these three, the BC routing channels serve the dual purpose of being able to both couple B1 blocks 20 together at the lowest level in the architecture, and also provide access to the expressway routing channels M1, M2, and M3 in the middle level of the architecture. In FIG. 3 aspects of the BC routing channels will be described, and in FIG. 4 aspects of the LM routing channels and the DC interconnect conductors will be described.

Turning now to FIG. 3, a B2×2 tile 22 including four B1 blocks 20 is illustrated. Associated with each of the B1 blocks 20 is a horizontal BC routing channel 50-1 and a vertical BC routing channel 50-2. Each horizontal BC routing channel 50-1 and vertical BC routing channel 50-2 is coupled to an expressway tab (E-tab) 52 to provide access for each B1 block 20 to the vertical and horizontal expressway routing channels M1, M2, and M3, respectively.

An E-tab 52 is an active device that includes tri-state buffers and a matrix of reprogrammable switches. The reprogrammable switches are preferably a pass device controlled by an SRAM bit. The interconnect conductors in the BC routing channels 50 and the expressway routing channels M1, M2, and M3 that are fed into an E-tab 52 may be coupled by the programmable switches to many of the other interconnect conductors in the expressway routing channels M1, M2, and M3 that come into the E-tab 52. Further, the expressway routing channels M1, M2, and M3 that are fed into an E-tab 52 continue in the same direction through the E-tab 52, even through the interconnect conductors are coupled to other interconnect conductors by the reprogrammable switches.

At the E-tabs 52, the signals provided on the BC routing channels 50 can connect to any of the expressway routing channels M1, M2, or M3. Once a signal emanating from a B1 block 20 has been placed on an expressway routing channel M1, M2 or M3 and traversed a selected distance, an E-tab 52 is employed to direct that signal onto a horizontal or vertical BC routing channel 50-1 or 50-2 into a B1 block 20 at a selected distance from the B1 block 20 from which the signal originated. As the connection between the routing resources at the lowest level in the architecture and the routing resources in the middle level of the architecture, the E-tabs 52 provide that the place and route of signals both inside and outside the B 1 blocks 20 may be implemented independently from one another.

To avoid overcomplicating the disclosure and thereby obscuring the present invention an E-tab 52 is not described in detail herein. An implementation of an E-tab 52 suitable for use according to the present is disclosed in U.S. patent application Ser. No. 09/519,081, filed Mar. 6, 2000, now issued as U.S. Pat. No. 6,567,968, and hereby incorporated by reference.

Figure 4:
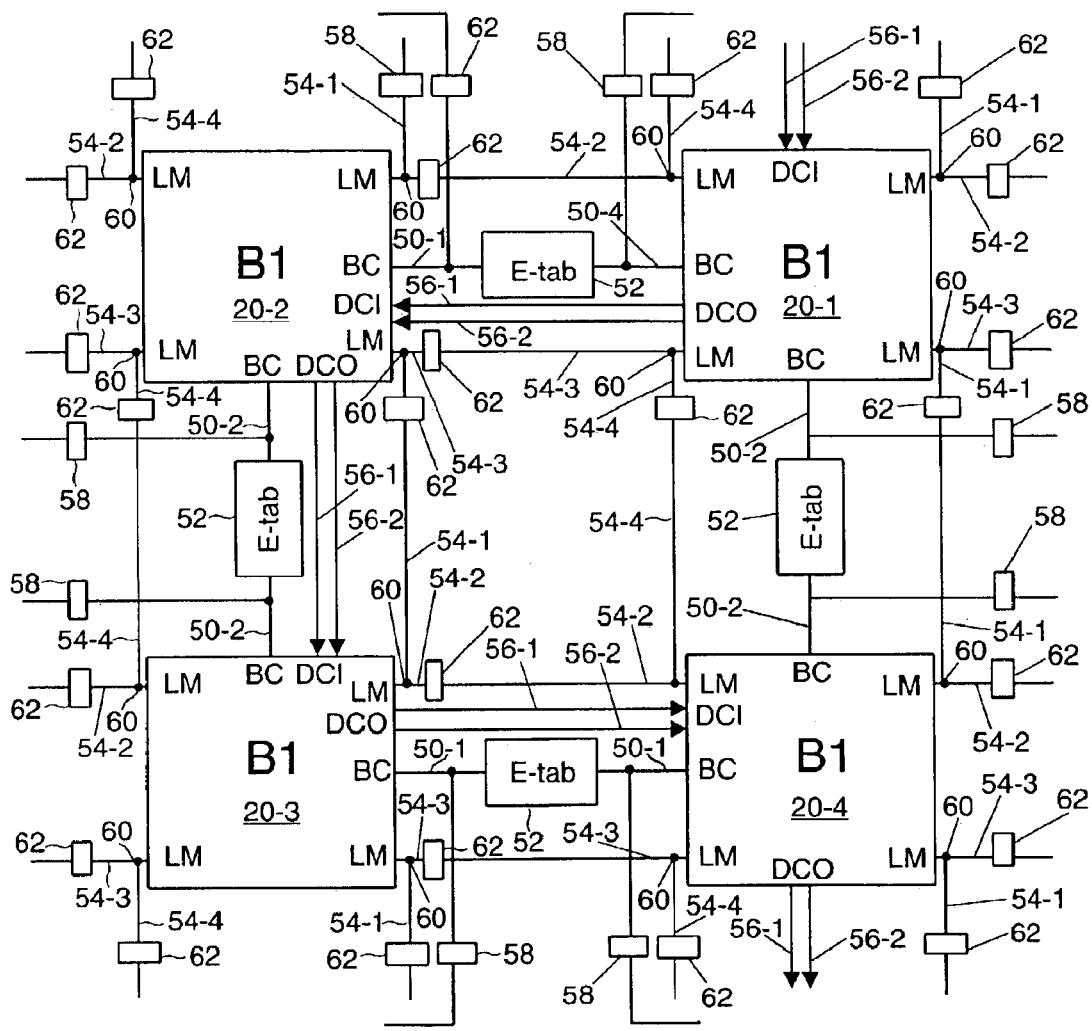
FIG. 4 is a block diagram of a B2×2 tile in an FPGA and the routing resources in the lowest level of a semi-hierarchical architecture according to the present invention.

In FIG. 4, the expressway routing channels M1, M2, and M3 and the E-turn 34 have been omitted for clarity. As further depicted in FIG. 4, in addition to the horizontal and vertical BC routing channels 50-1 and 50-2 associated with each B1 block 20, there are also associated with each B1 block 20 four LM routing channels 54-1 through 54-4 and first and second DC interconnect conductors 56-1 and 56-2. The BC routing channels 50, the LM routing channels 54, and the DC interconnect conductors 56 provide significantly better performance than a strict hierarchy, and further help avoid congesting the expressway routing channels M1, M2, and M3. The BC routing channels 50 and the LM routing channels 54 combine to form two meshes. One is a mesh connection within a B1 block 20, and a second is a mesh connection between B1 blocks 20.

The BC routing channels 50 provide portions of the two meshes. The portion of the mesh connection within a B1 block 20 is described below. In the portion of the mesh providing connection between adjacent B1 blocks 20, each horizontal and vertical BC routing channel 50-1 and 50-2 share an E-tab 52 with a horizontal or vertical BC routing channel 50-1 and 50-2 in an adjacent B1 block 20 that may be employed to couple a signal between adjacent B1 blocks 20 in a first direction. Further, each horizontal and vertical BC routing channel 50-1 and 50-2 share a BC extension 58 with a horizontal or vertical BC routing channel 50-1 and 50-2 in an adjacent B1 block 20 that may be employed to couple a signal between adjacent B1 blocks 20 in a second direction.

The BC extensions 58 provide a one-to-one coupling between the interconnect conductors of the BC routing channels 50 on either side of the BC extensions 58. Accordingly, each BC routing channel 50, in the horizontal and vertical directions is coupled to the adjacent B1 blocks 20 in the corresponding horizontal and vertical directions by a E-tab 52 in a first direction along both the horizontal and vertical and in a second direction along both the horizontal and vertical by a BC extension 58. It should be appreciated that the one-to one coupling between the interconnect conductors of the BC routing channels 50 on either side of the BC extensions 58 may be implemented in a variety of ways known to those of ordinary skill in the art. One example is a passgate controlled by an SRAM bit. Other implementations will be readily appreciated by those of ordinary skill in the art.

From drawing FIG. 4, it should be appreciated that the LM routing channels 54-1 through 54-4 pass through the B1 block 20 as two vertical LM routing channels 51-1 and 54-4 and two horizontal LM routing channels 54-2 and 54-3, and that the intersections 60 of the vertical and horizontal LM routing channels 54 are hardwired along a diagonal.

The LM routing channels 54 also provide portions of the two meshes. The portion of the mesh connection formed along with the BC routing channels 50 within a B1 block 20 will be described below. In the portion of the mesh formed along with BC routing channels between B1 block 20, each of the four LM routing channels 54-1 through 54-4 in each B1 block 20 shares an LM extension 62 with an LM routing channel 54-1 through 54-4 in an adjacent B1 block 20 in either the corresponding horizontal or vertical direction that may be employed to couple a signal between adjacent B1 blocks 20 in either the horizontal or vertical direction.

The LM extensions 62 provide a one-to-one coupling between the interconnect conductors of the LM routing channels 54 on either side of the LM extensions 62. Accordingly, between adjacent B1 blocks 20 there are two LM routing channels 54 from each of the adjacent B1 blocks coupled by a LM extension 62 on all sides of adjacent B1 blocks 20. It should be appreciated that the one-to one coupling between the interconnect conductors of the LM routing channels 54 on either side of the LM extensions 62 may be implemented in a variety of ways known to those of ordinary skill in the art. One example is a passgate controlled by an SRAM bit. Other implementations will be readily appreciated by those of ordinary skill in the art.

The DC interconnect conductors 56-1 and 56-2 form a high performance direct connection between the logic elements in adjacent B1 blocks 20 to implement data path functions such as counters, comparators, adders and multipliers. As will be described below, each B1 block 20 includes four clusters of logic elements. Preferably, each of the four clusters includes two three input look-up tables (LUT3), a single two-input look-up table (LUT2), and a D-type flip-flop (DFF). In the DC interconnect conductor routing path, each of the DC interconnect conductors 56-1 and 56-2 is multiplexed to an input to a separate one of the two LUT3s in each of the four clusters of a B 1 block 20. The DC interconnect conductors 56-1 and 56-2 are connected between vertically adjacent B1 blocks 20 as is illustrated in FIG. 4.

Figure 5:
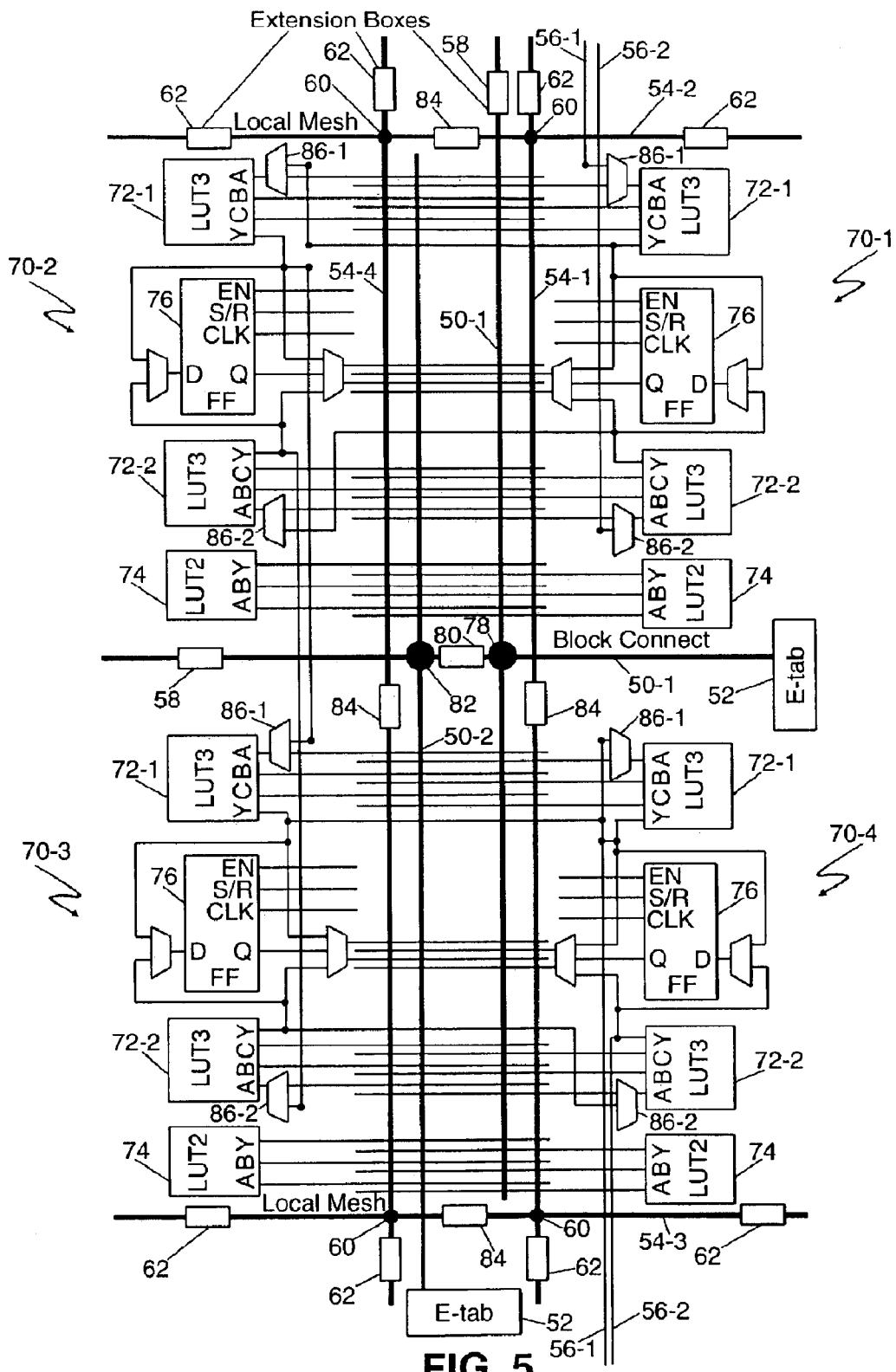
FIG. 5 is a block diagram of a B1 block in an FPGA and the routing resources in the lowest level of a semi-hierarchical architecture according to the present invention.

FIG. 5 illustrates a B1 block 20 according to the present invention in greater detail. As described above, each B1 block 20 includes four clusters 70-1 through 70-4 of devices. Each of the four clusters 70-1 through 70-4 includes first and second LUT3s 72-1 and 72-2, respectively, a LUT2 74, and a DFF 76. Each of the LUT3s 72 have first, second, and third inputs indicated as "A," "B," and "C," and a single output indicated as "Y." Each of the LUT2s 74 have first and second inputs indicated as "A" and "B," and a single output indicated as "Y." With a LUT3 72, any three input Boolean logic function may be implemented, and with a LUT2 74 any two input Boolean logic function may be implemented.

Each DFF 76 has a data input indicated as "D" and a data output indicated as "Q." In each of the clusters 70-1 through 70-4, the outputs "Y" of the LUT3s 72-1 and 72-2 are multiplexed to the input of DFF 76, and further multiplexed with the output of the DFF 76 to form first and second outputs of each of the clusters 70-1 through 70-4.

Each DFF 76 also has an enable (EN) input, a set/reset (S/R) input, and a clock (CLK) input. The EN, S/R, and CLK input are coupled to utility routing channels, a discussion of which is beyond the scope of this disclosure, but which is found in U.S. patent application Ser. No. 09/255,060, filed Feb. 22, 1999, now abandoned, and hereby incorporated by reference.

Within the B1 block 20, the horizontal BC routing channel 50-1 is disposed between the upper clusters 70-1 and 70-2 and the lower clusters 70-3 and 70-4, and the vertical BC routing channel 50-2 is disposed between the two clusters 70-1 and 70-3 on the left side of the B1 block 20 and the two clusters 70-2 and 70-4 on the right side of the B1 block 20. It should be appreciated that due to the layout of the B1 block depicted in FIG. 4 wherein the input and outputs of the devices in the clusters 70-1 through 70-4 are all depicted horizontally, the horizontal BC routing channel 50-1 forms a diagonally hardwired connection at 78 with a routing channel that effectively sends the horizontal BC routing channel 50-1 in a vertical direction. A diagonally hardwired connection 82 pairwise shorts the horizontal and vertical BC routing channels 50-1 and 50-2 to provide dual accessibility to the logic resources in the B1 block 20 from more than one side.

Disposed between the diagonally hardwired connection 78 and the diagonally hardwired connection 82 is a BC splitting extension 80 which provides a one-to-one coupling between the interconnect conductors of the horizontal BC routing channel 50-1 on either side of the BC splitting extension 80. It should be appreciated that the one-to-one coupling between the interconnect conductors of the horizontal BC routing channel 50-1on either side of the BC splitting extension 80 may be implemented in a variety of ways known to those of ordinary skill in the art. One example is a passgate controlled by an SRAM bit. Other implementations will be readily appreciated by those of ordinary skill in the art.

According to the present invention providing the BC splitting extension 80 enhances the routability of the horizontal and vertical BC routing channels 50-1 and 50-2 to the inputs and outputs of the devices in the clusters 70-1 through 70-4. Although the hardwired diagonal connection 82 is disposed at the intersections of the interconnect conductors in the horizontal BC channel 50-1 and the interconnect conductors in the vertical BC channel 50-2 so that all of the interconnect conductors in the horizontal and vertical BC channels 50-1 and 50-2 are accessible to each of the four clusters 70-1 through 70-4, the BC splitting extension 80 essentially splits, the BC channel 50-1 from the BC channel 50-2. With the BC splitting extension 80, the flexibility for connecting the logic resources to the M1, M2, and M3 routing channels is improved from the flexibility provided simply by the hardwired diagonal connection 82.

The LM routing channels 54-1 and 54-4 pass vertically through the B1 block 20 and the LM routing channels 54-2 and 54-3 pass horizontally through the B1 block 20. Each of the LM routing channels 54 is segmented in the B1 block 20 by extensions 84. The extensions 84 provides a one-to-one coupling between the interconnect conductors of the LM routing channels 54 on either side of the extensions 84. It should be appreciated that the one-to-one coupling between the interconnect conductors of the LM routing channel 54 on either side of the extensions 84 may be implemented in a variety of ways known to those of ordinary skill in the art. One example is a passgate controlled by an SRAM bit. Other implementations will be readily appreciated by those of ordinary skill in the art. Further, as described above, the intersections 60 of the vertical LM routing channels 54-1 and 54-4 and horizontal LM routing channels 54-2 and 54-3 are hardwired along a diagonal.

The horizontal and vertical BC routing channels 50-1 and 50-2, and the two vertical LM routing channels 54-1 and 54-4 form intersections with the inputs and outputs of the LUT2s 74, the inputs of the LUT3s 72-1 and 72-2, and the multiplexed outputs of the LUT3s 72-1 and 72-2 and the DFF 76 in each of the clusters 70-1 through 70-4.

At some of the intersections formed between the horizontal and vertical BC routing channels 50-1 and 50-2, and the two vertical LM routing channels 54-1 and 54-4 and the inputs of the LUT2s 74 and the inputs of the LUT3s 72-1 and 72-2 are disposed reprogrammable elements. For each separate LUT2s 74 and the LUT3s 72-1 and 72-2 input, the reprogrammable elements disposed at selected intersections are preferably passgates controlled by SRAM bits that multiplex the horizontal and vertical BC routing channels 50-1 and 50-2, and the two vertical LM routing channels 54-1 and 54-4 with the separate input. Accordingly, at a given time, each separate LUT2s 74 and the LUT3s 72-1 and 72-2 input may be coupled by a reprogrammable element to only one of the interconnect conductors in the horizontal and vertical BC routing channels 50-1 and 50-2, and the two vertical LM routing channels 54-1 and 54-4.

At some of the intersections formed between the horizontal and vertical BC routing channels 50-1 and 50-2, and the two vertical LM routing channels 54-1 and 54-4 and the outputs of the LUT2s 74 and the multiplexed outputs of the LUT3s 72-1 and 72-2 and the DFF 76 are disposed reprogrammable elements, such as a pass gate controlled by an SRAM bit. These selected intersections, unlike the intersections formed between the horizontal and vertical BC routing channels 50-1 and 50-2, and the two vertical LM routing channels 54-1 and 54-4 and the inputs of the LUT2s 74 and the inputs of the LUT3s 72-1 and 72-2, are not multiplexed. Accordingly, at a given time, each separate LUT2 74 output and LUT3 72-1 and 72-2 and DFF 76 multiplexed output may be coupled to any of the interconnect conductors in the horizontal and vertical BC routing channels 50-1 and 50-2, and the two vertical LM routing channels 54-1 and 54-4 having a reprogrammable element disposed at an intersection. It should be appreciated, that no more than one LUT2 74 output and LUT3 72-1 and 72-2 and DFF 76 multiplexed output may be coupled simultaneously to the same interconnect conductor in the horizontal and vertical BC routing channels 50-1 and 50-2, and the two vertical LM routing channels 54-1 and 54-4.

As described above, each of the DC interconnect conductors 56-1 and 56-2 is multiplexed by multiplexers 86-1 and 86-2, respectively, in a serial fashion to an input of a separate one of the two LUT3s in each cluster 70-1 through 70-4 of a B1 block 20. For example, in the serial connection, the DC interconnect conductor 56-1 is multiplexed to the "A" input of the LUT3 72-1 of the cluster 70-1. Next, the "Y" output of the LUT3 72-1 in cluster 70-1 is multiplexed to the "A" input of the LUT3 72-1 in cluster 70-2. Next, the "Y" output of the LUT3 72-1 in cluster 70-2 is multiplexed to the "A" input of the LUT3 72-1 in cluster 70-3. Next, the "Y" output of the LUT3 72-1 in cluster 70-3 is multiplexed to the "A" input of the LUT3 72-1 in cluster 70-4. Finally, the "Y" output of the LUT3 72-1 in cluster 70-4 pass out of the B1 block 20, and is multiplexed to the "A" input of the LUT3 72-1 in cluster 70-2 of the B1 block 20 disposed vertically below. The DC interconnect conductors 56-2 is similarly connected, except that it is input and output from the LUT3 72-2 in each of the clusters 70-1 through 70-4.

Figure 6:
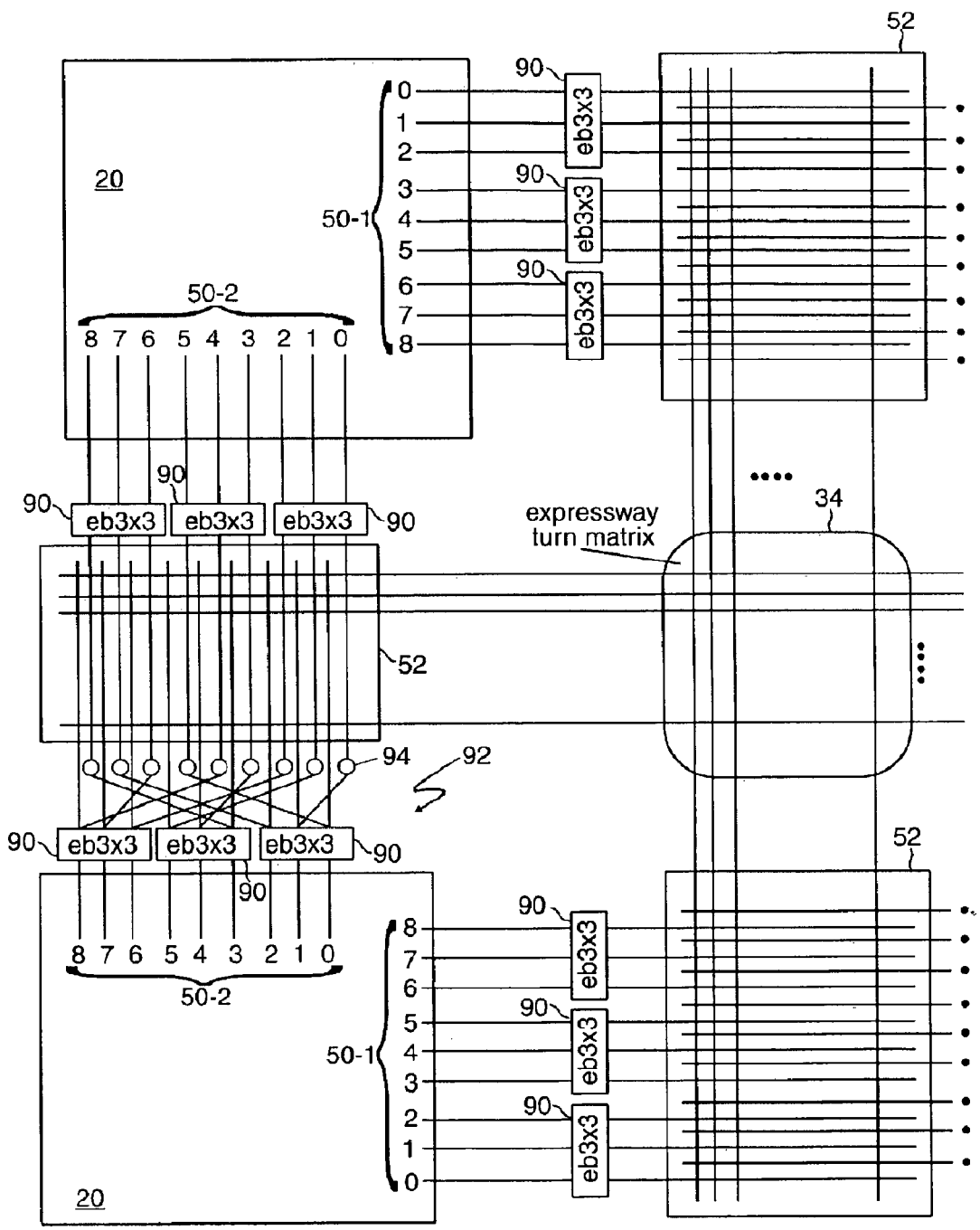
FIG. 6 illustrates the coupling of BC routing channels to a E-tab according to the present invention.

Turning now to FIG. 6, a more detailed block diagram of the coupling of BC routing channels 50 to a BC tab 52 is illustrated. According to the preferred embodiment, the nine interconnect conductors in each of the BC routing channels 50 are grouped into three groups of three interconnect conductors. Each group of three interconnect conductors is connected to a first side of an Extension Block (EB) 3×3 switch matrix 90. A second side of each EB 3×3 switch matrix 90 is coupled to the E-tab 52. Further, between adjacent B1 blocks 20, in both the horizontal and vertical directions, the leads on the second side of a first EB 3×3 switch matrix 90 may be coupled to the leads on the second side of second EB 3×3 switch matrix 90 by BC criss-cross extension 92. The open circles in the criss-cross extension 92, one of which is indicated by the reference numeral 94, represent a reprogrammable element, preferably a passgate controlled by an SRAM bit Because the number of interconnect conductors in the BC routing channels 50 are far fewer than the number of interconnect conductors in the M1, M2 and M3 routing channels, the EB 3×3 switch matrices 90 and BC criss-cross extensions 92, according to the present invention, contribute significantly to the routability of the FPGA in the connection of the BC routing channels 50 to the M1, M2, and M3 routing channels in the FPGA by providing symmetrization. If all of the interconnect conductors in the BC routing channels 50 are completely symmetrized in their connection to M1, M2, and M3 channels, the area occupied on the FPGA could be quite large when the number of interconnect conductors N is large, because the area occupied by symmetrizing circuitry increases approximately according to a function of $N^2$. Accordingly, in the preferred embodiment of the present invention, the grouping of the interconnect conductors in the BC routing channels 50 into three groups of three represents a partial symmetrization of the interconnect conductors in the BC routing channels 50 wherein each of the interconnect conductors in a particular group are symmetrized with respect to one another.

Figure 7:
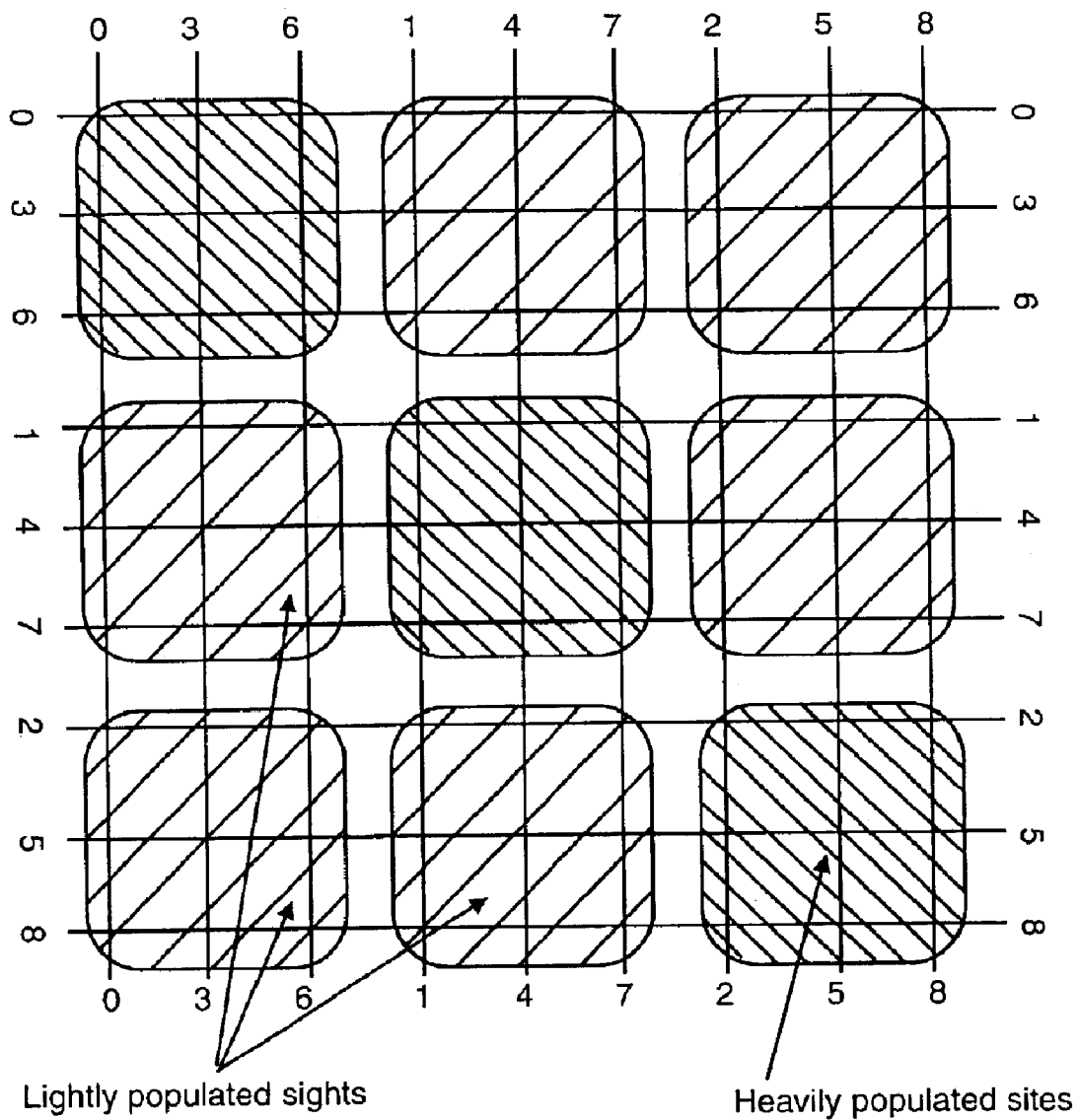
FIG. 7 illustrates a block diagram of an E-turn according to the present invention.

Turning now to FIG. 7, a block diagram of an E-turn 34 according to the present invention is illustrated. In general, an E-turn 34 is sparsely populated at less than 10 percent of the total possibly populated sites. This is a result of CMOS process geometry. A populated bi-directional E-turn matrix 34 site typically requires a configuration bit and a fairly large N-channel MOS pass transistor to offer sufficient current to drive the capacitance connected to the expressways in the middle level of the FPGA architecture. The total number of memory bits pass transistors which can geometrically fit below the area of N vertical and N horizontal minimum width metal interconnect conductors is between about 5 percent and about 10 percent of $N^2$. It should be appreciated by those of ordinary skill in the art that there is a tradeoff between the number of populated sites and the performance that can be provided by larger pass transistors.

In FIG. 7, unlike FIG. 6, the indices for the interconnect conductors which are adjacent one another are not sequential. It should also, however, be understood that in FIG. 6, the indices 0-8 for the interconnect conductors in the BC routing channels 50 are for individual conductors, whereas the indices 0-8 in FIG. 7 are for nine busses, each of which has nine interconnect conductors. As described above these nine busses are one M1 routing channel, two M2 routing channels and six M3 routing channels. In FIG. 7, it can be observed that there are both lightly populated sites and heavily populated sites. It should be appreciated that the busses with indices 0, 3, and 6 are heavily populated with one another, and that these three indices correspond to different EB 3×3 switch matrices 90. This also true for indices 1, 4, and 7 and for 2, 5, and 8. By heavily populating the busses that correspond to different EB 3×3 switch matrices 90, and lightly populating (or not populating at all) the busses that correspond to the same EB 3×3 switch matrix 90, the connectivity per populated site is improved. The degree to which sites are either lightly or heavily populated depends on the amount of population that can be accommodated.

Figure 8:
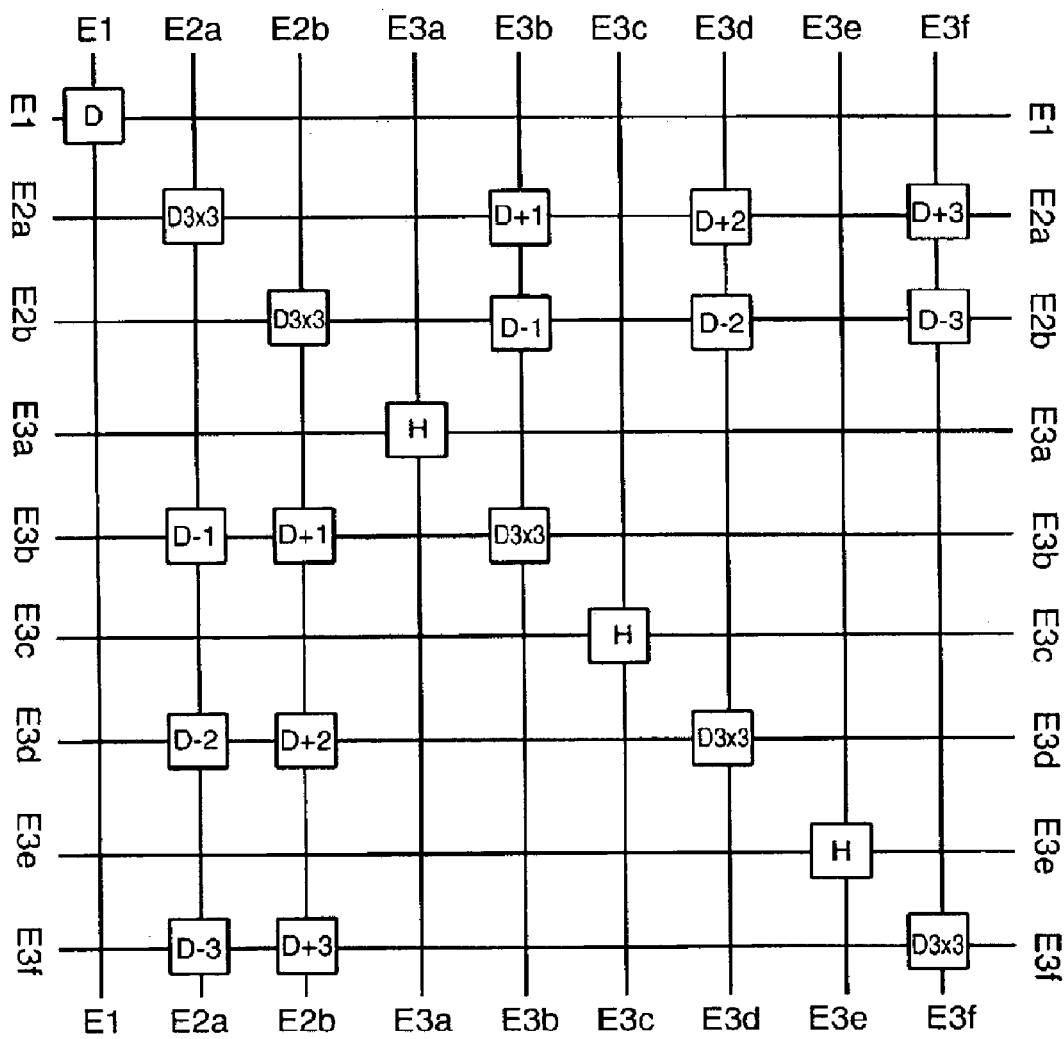
FIG. 8 illustrates a preferred embodiment of an E-turn according to the present invention.
Figure 9A:
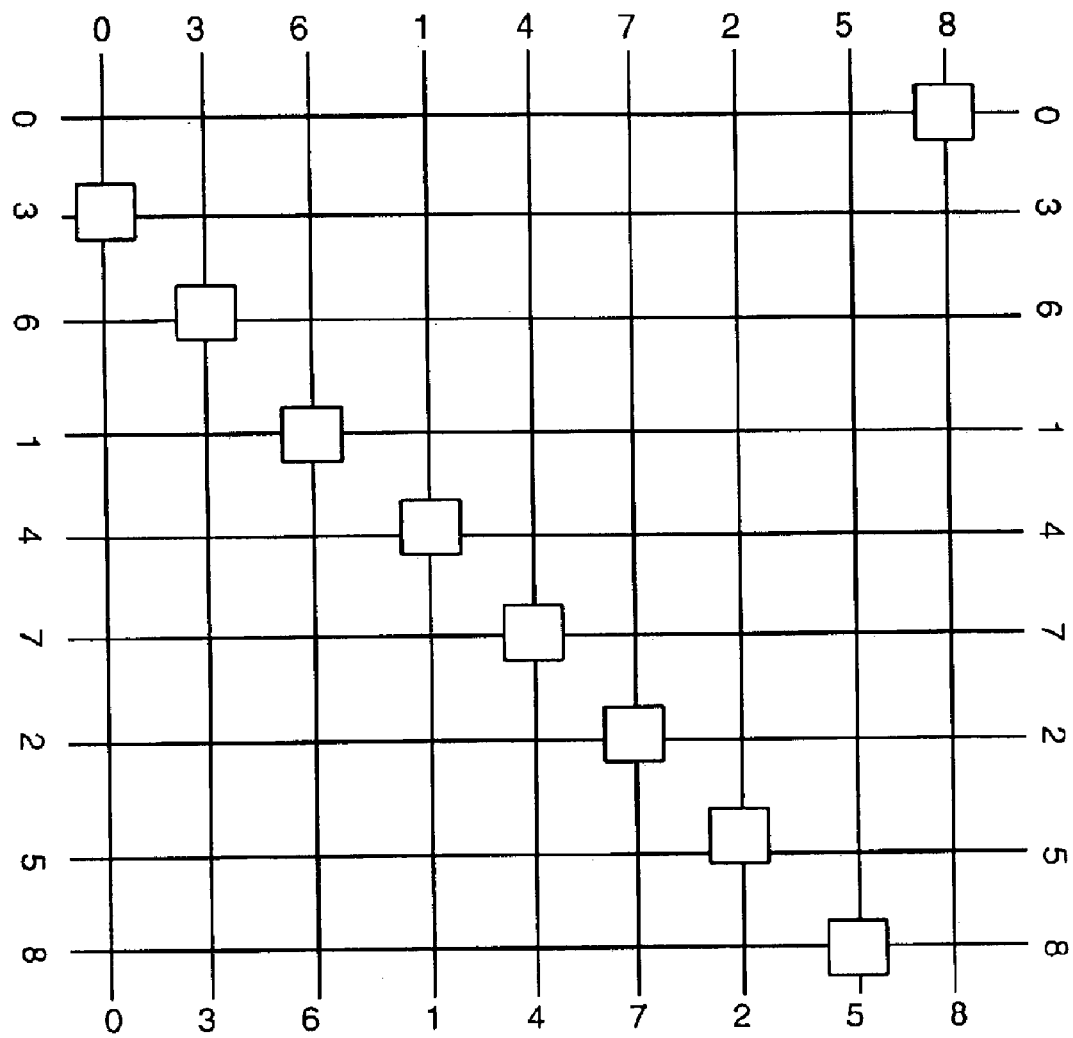
FIGS. 9A, 9B, and 9C illustrate the populated locations for D−1, D+3, and D3×3 matrices, respectively, according to the present invention.
Figure 9B:
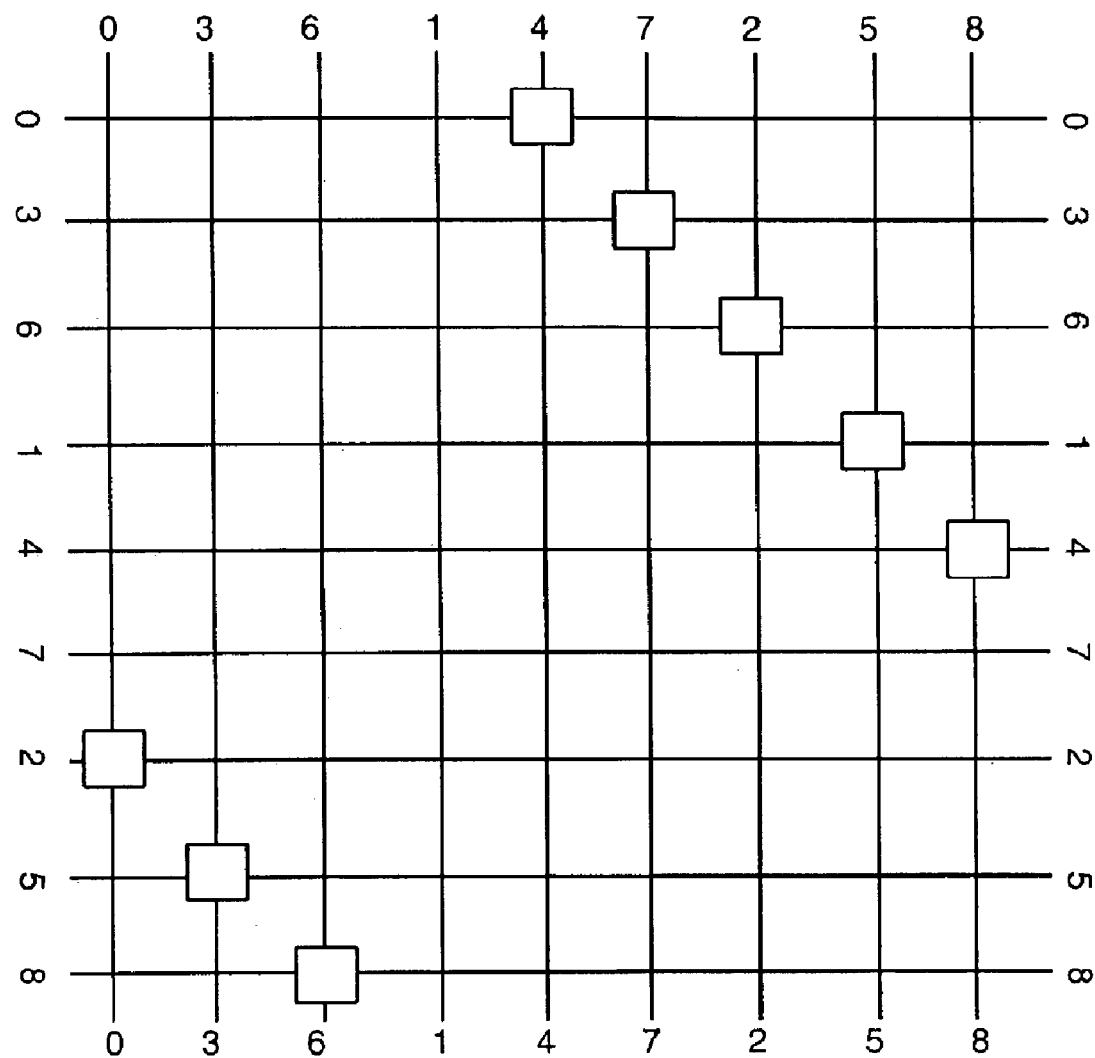
Figure 9C:
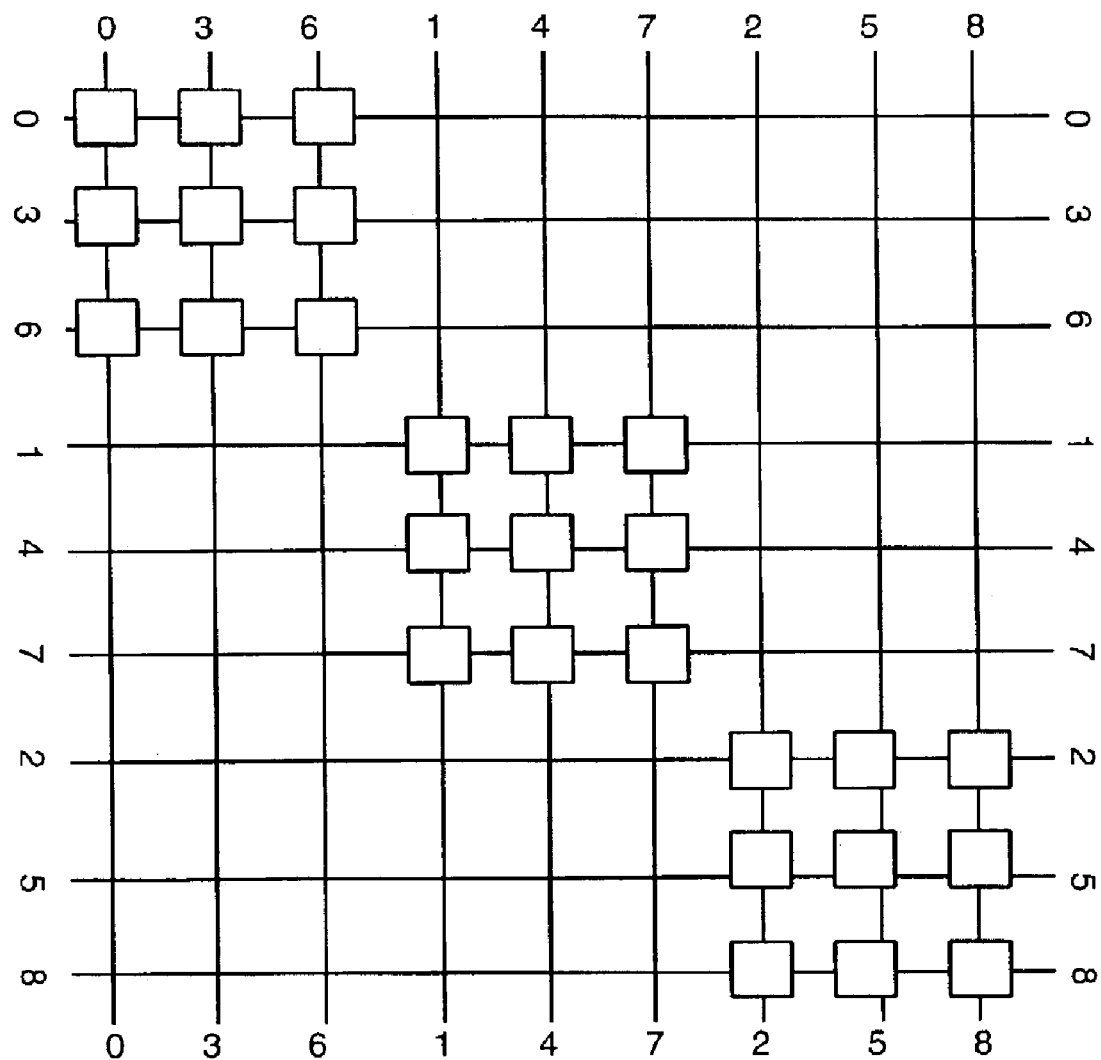

Turning now to FIG. 8, a preferred embodiment of an E-turn 34 according to the present invention is illustrated. E-turn 34 includes horizontal and vertical M1 routing channel each having 9 interconnect conductors, first and second horizontal M2a and M2b routing channels, respectively, each having 9 interconnect conductors, and first through sixth horizontal and vertical M3a through M3f routing channels, respectively, each having 9 interconnect conductors. Disposed at the intersections of some of the horizontal and vertical M1, M2, and M3 routing channels are boxes with various designations, including, D, D+1, D+2, D+3, D−1, D−2, D−3, D3×3, and H. A box designated D has reprogrammable elements disposed along a diagonal. The designations D+1, D+2, D+3, D−1, D−2, D−3, are for matrices that have the same number of reprogrammable elements as D, but are either shifted up or down by 1, 2, or 3 units. FIGS. 9A and 9B, boxes illustrate the populated locations for D−1 and D+3 matrices respectively. The population of a D3×3 matrix is illustrated in FIG. 9C.

Figure 10:
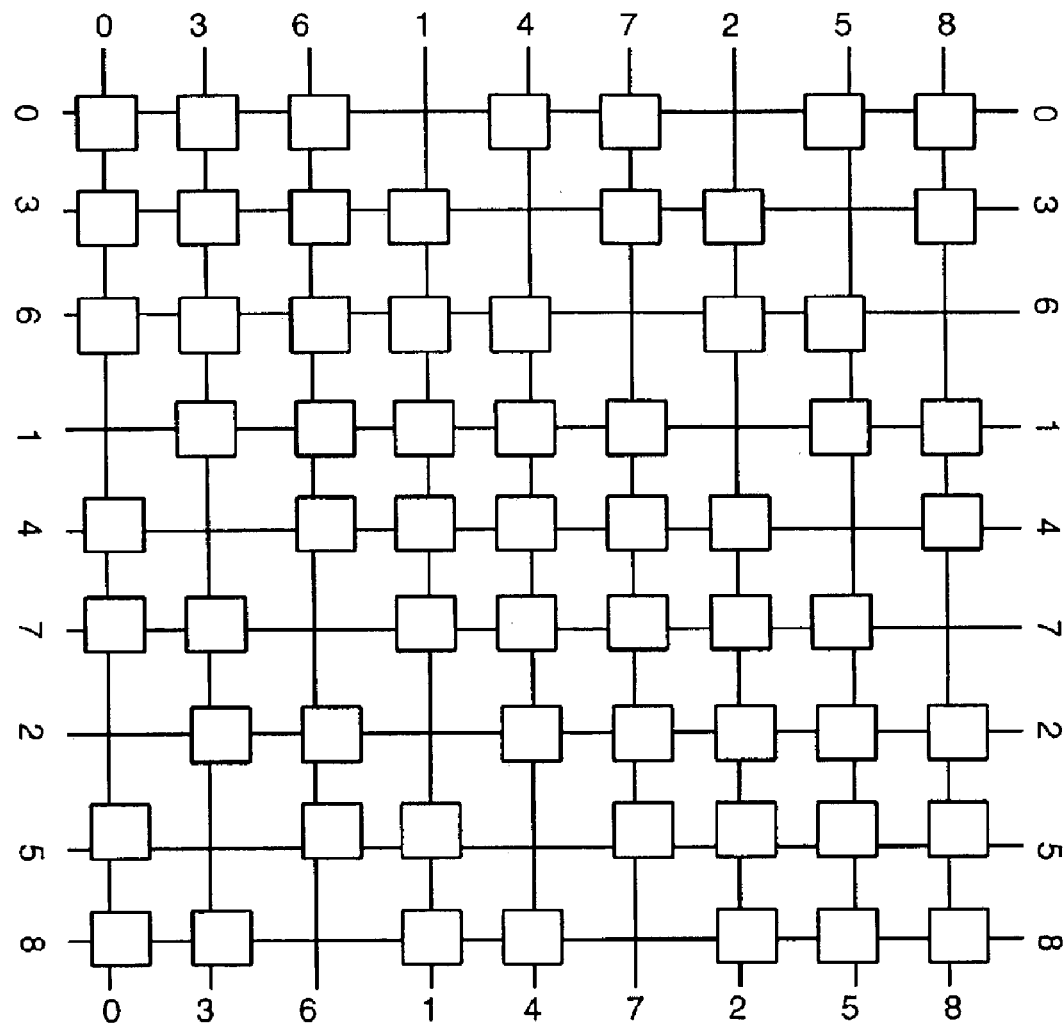
FIG. 10 illustrates the populated locations for an H matrix according to the present invention.

In FIG. 10, the population of the reprogrammable elements in a heavily populated (H) matrix is illustrated. The H matrix first and second types of 3×3 submatrices, one that is fully populated, and another that has is diagonal depopulated. This matrix has the characteristic that it can provide the connection of any 9 signals in any given order, by a chosen imposed order in the other direction.

Figure 11:
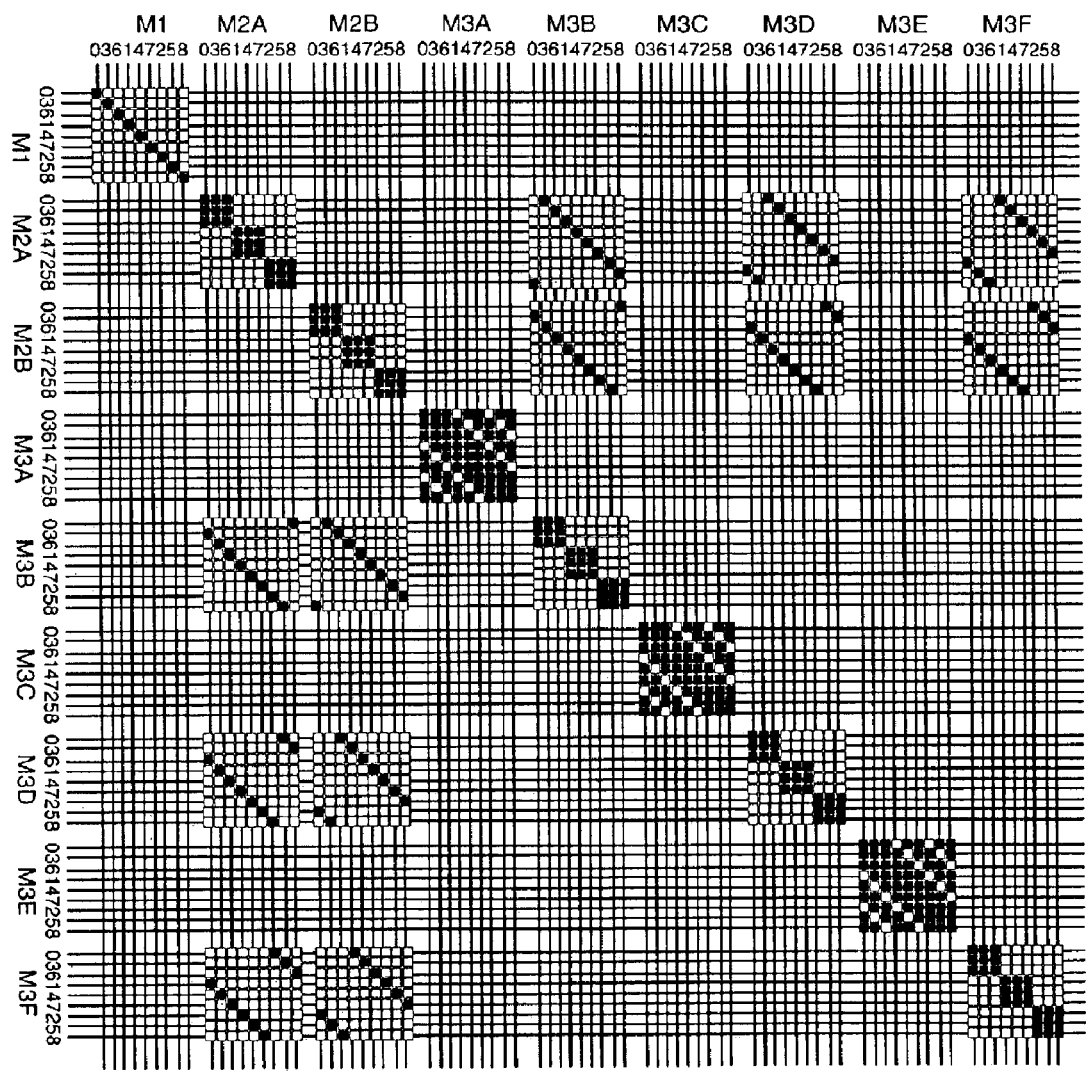
FIG. 11 is an illustration of the E-turn shown in FIG. 8 with all of the reprogrammable elements indicated by solid, dark squares according to the present invention.
Figure 12A:
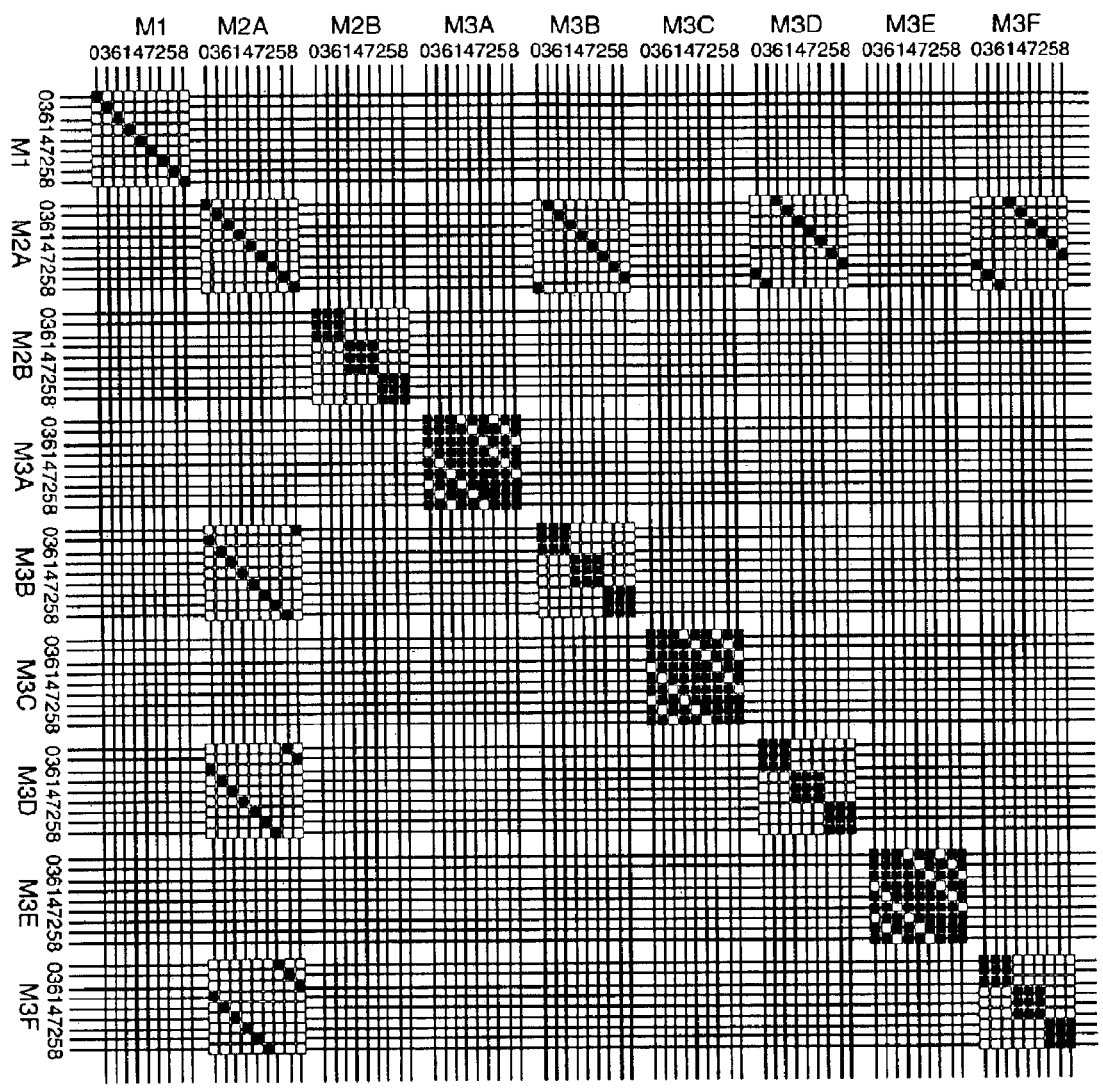
FIGS. 12A-12E illustrate alternative E-turn reprogrammable element population patterns suitable for use according to the present invention.
Figure 12B:
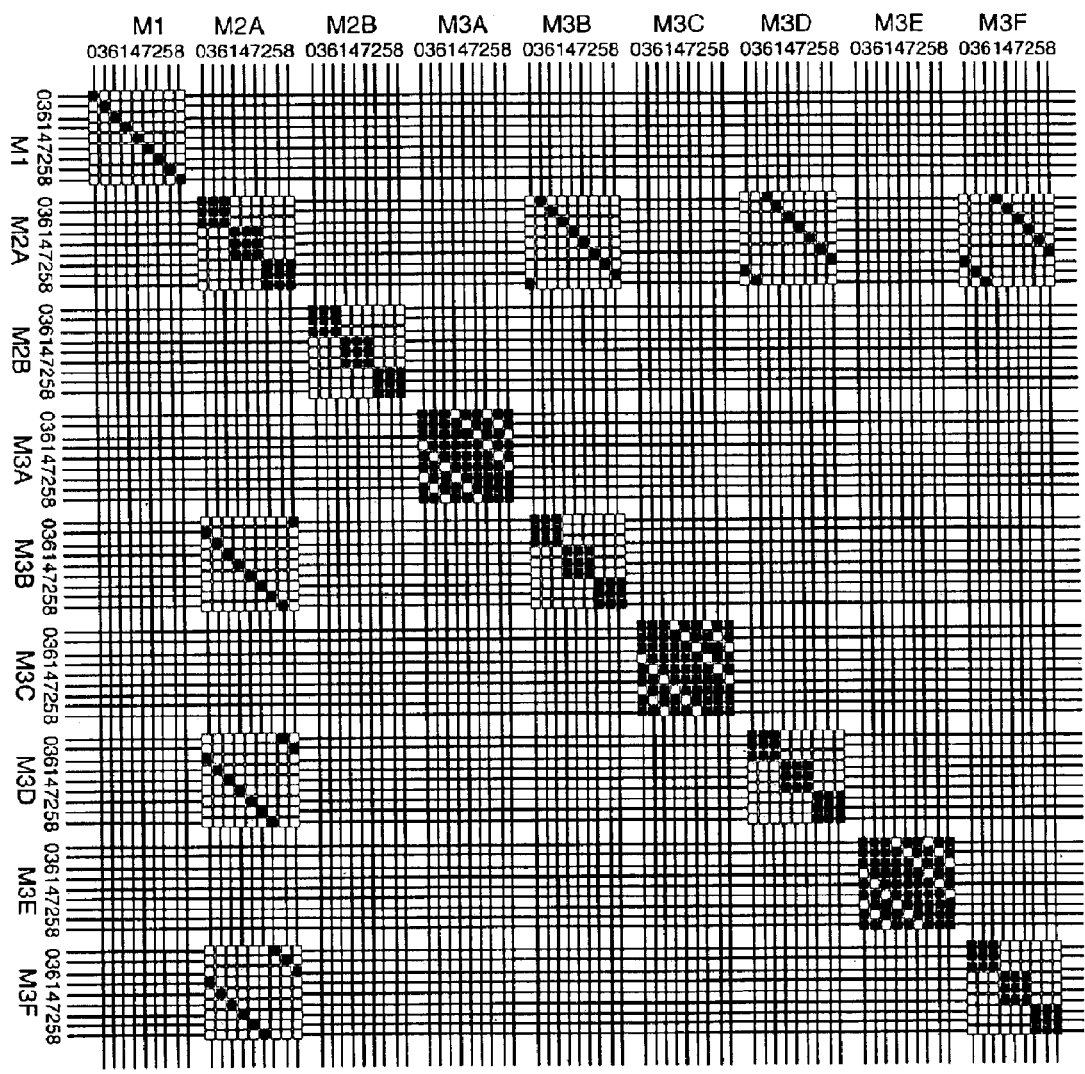
Figure 12C:
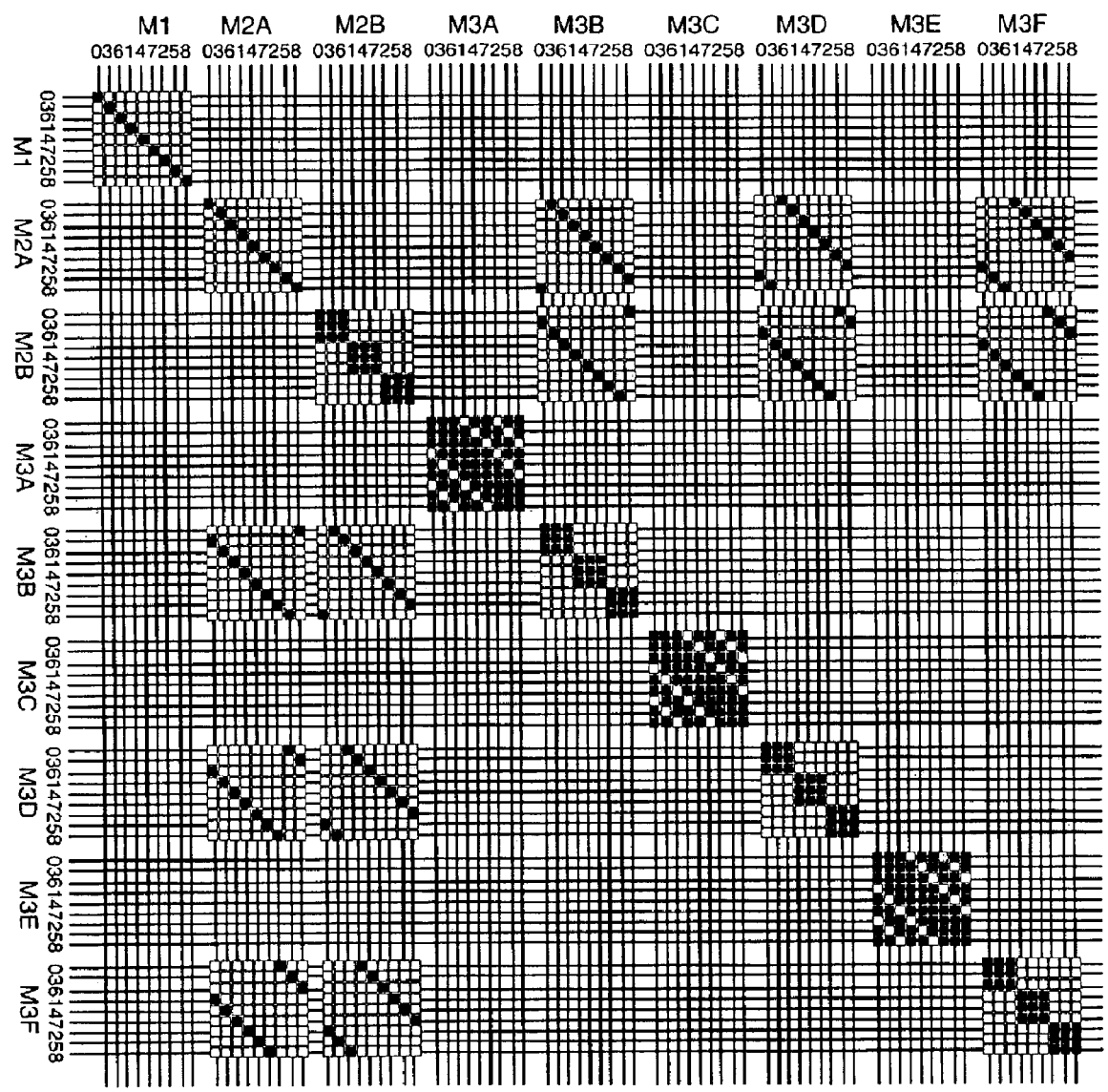
Figure 12D:
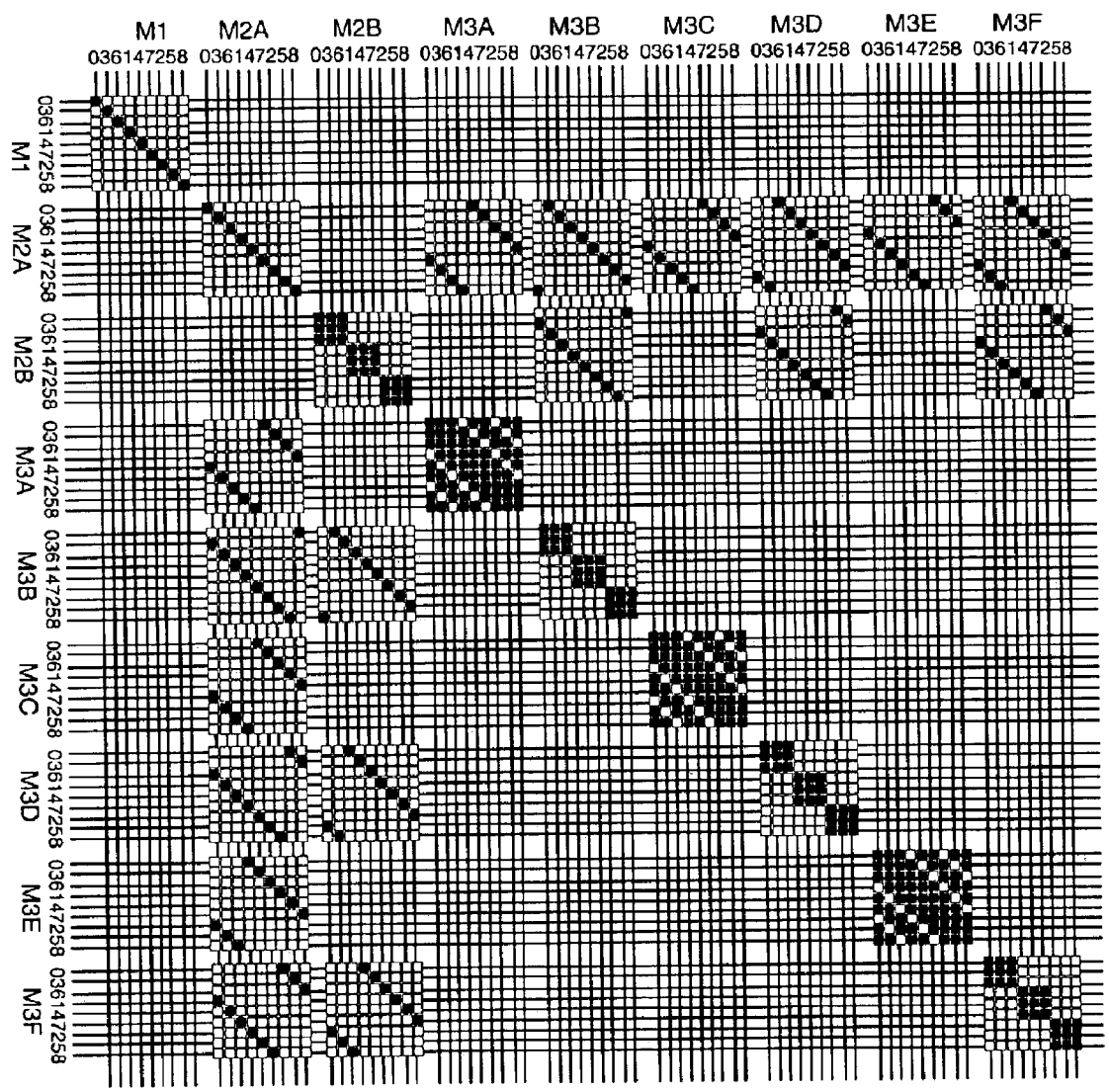
Figure 12E:
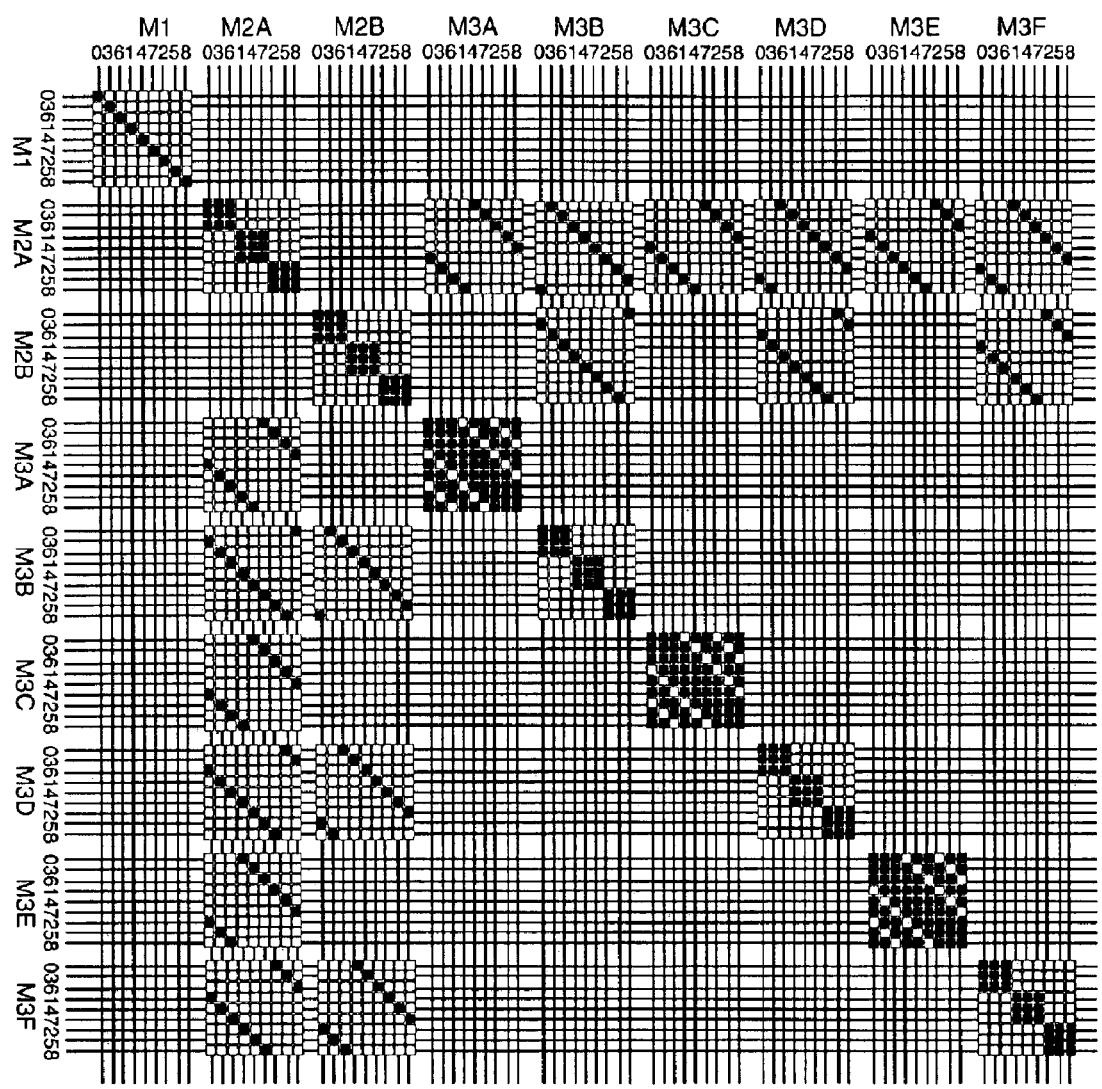

FIG. 11 is an illustration of the E-turn 34 shown in FIG. 8 with all of the reprogrammable elements indicated by solid, dark squares. FIGS. 12A-12E illustrate alternative E-turn 34 reprogrammable element population patterns suitable for use according to the present invention.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An integrated circuit device containing a field programmable gate away having an architecture for routing channels comprising:
   a first plurality of routing channels having a first direction;
   a second plurality of routing channels having a second direction perpendicular to said first direction, said first plurality of routing channels intersecting said second plurality of routing channels to form a plurality of matrices of intersecting interconnect conductors in said routing channels;
   a first number of reprogrammable elements disposed at intersections in a first one of said plurality of matrices, said first number of reprogrammable elements disposed on said intersecting interconnect conductors in a first pattern;
   a second number of reprogrammable elements disposed at intersections in a second one of said plurality of matrices, said second number of reprogrammable elements greater than said first number of reprogrammable elements, and said second number of reprogrammable elements disposed on said intersecting interconnect conductors in a second pattern distinct from said first pattern;

a third number of reprogrammable elements disposed at intersections in a third one of said plurality of matrices, said third number of reprogrammable elements greater than said second number of reprogrammable elements, and said third number of reprogrammable elements disposed on said intersecting interconnect conductors in a third pattern distinct from said first pattern and said second pattern; and a plurality of logic blocks coupled to one another through said first plurality of routing channels and said second plurality of routing channels, wherein each one of said plurality of logic blocks comprises a plurality of clusters, each one of said plurality of logic clusters comprising a plurality of lookup tables each having a plurality of inputs and an output and a D flip-flop having an input and an output.

2. The integrated circuit device of claim 1, wherein:
said plurality of lookup tables comprising:
at least one three-input lookup table.

3. The integrated circuit device of claim 1, wherein:
said plurality of lookup tables comprising:
at least two three-input lookup table; and
at least one two-input lookup table.

4. The integrated circuit device of claim 1, wherein:
one of said first number, said second number, and said third number of reprogrammable elements are disposed on said intersecting interconnect conductors in a diagonal pattern.

5. The integrated circuit device of claim 1, wherein:
one of said first number, said second number, and said third number of reprogrammable elements are disposed on said intersecting interconnect conductors in a diagonal minus one pattern.

6. The integrated circuit device of claim 1, wherein:
one of said first number, said second number, and said third number of reprogrammable elements are disposed on said intersecting interconnect conductors in a diagonal minus two pattern.

7. The integrated circuit device of claim 1, wherein:
one of said first number, said second number, and said third number of reprogrammable elements are disposed on said intersecting interconnect conductors in a diagonal minus three pattern.

8. The integrated circuit device of claim 1, wherein:
one of said first number, said second number, and said third number of reprogrammable elements are disposed on said intersecting interconnect conductors in a diagonal plus one pattern.

9. The integrated circuit device of claim 1, wherein:
one of said first number, said second number, and said third number of reprogrammable elements are disposed on said intersecting interconnect conductors in a diagonal plus two pattern.

10. The integrated circuit device of claim 1, wherein:
one of said first number, said second number, and said third number of reprogrammable elements are disposed on said intersecting interconnect conductors in a diagonal plus three pattern.

11. The integrated circuit device of claim 1, wherein:
one of said first number, said second number, and said third number of reprogrammable elements are disposed on said intersecting interconnect conductors in a fully populated pattern.

12. A method of providing a field programmable gate array having an architecture for routing channels comprising:
providing a first plurality of routing channels having a first direction;
providing a second plurality of routing channels having a second direction perpendicular to said first direction, said first plurality of routing channels intersecting said second plurality of routing channels to form a plurality of matrices of intersecting interconnect conductors in said routing channels;
disposing a first number of reprogrammable elements at intersections in a first one of said plurality of matrices, said first number of reprogrammable elements disposed on said intersecting interconnect conductors in a first pattern;
disposing a second number of reprogrammable elements at intersections in a second one of said plurality of matrices, said second number of reprogrammable elements greater than said first number of reprogrammable elements, and said second number of reprogrammable elements disposed on said intersecting interconnect conductors in a second pattern distinct from said first pattern;
disposing a third number of reprogrammable elements at intersections in a third one of said plurality of matrices, said third number of reprogrammable elements greater than said second number of reprogrammable elements, and said third number of reprogrammable elements disposed on said intersecting interconnect conductors in a third pattern distinct from said first pattern and said second pattern;
providing a plurality of logic blocks, wherein each one of said plurality of logic blocks comprises a plurality of clusters, each one of said plurality of logic clusters comprising a plurality of lookup tables each having a plurality of inputs and an output and a D flip-flop having an input and an output; and
coupling the plurality of logic blocks to one another through said first plurality of routing channels and said second plurality of routing channels.

13. The integrated circuit device of claim 12, wherein:
one of said first number, said second number, and said third number of reprogrammable elements are disposed on said intersecting interconnect conductors in a diagonal pattern.

14. The integrated circuit device of claim 12, wherein:
one of said first number, said second number, and said third number of reprogrammable elements are disposed on said intersecting interconnect conductors in a diagonal minus one pattern.

15. The integrated circuit device of claim 12, wherein:
one of said first number, said second number, and said third number of reprogrammable elements are disposed on said intersecting interconnect conductors in a diagonal minus two pattern.

16. The integrated circuit device of claim 12, wherein:
one of said first number, said second number, and said third number of reprogrammable elements are disposed on said intersecting interconnect conductors in a diagonal minus three pattern.

17. The integrated circuit device of claim 12, wherein:
one of said first number, said second number, and said third number of reprogrammable elements are disposed on said intersecting interconnect conductors in a diagonal plus one pattern.

18. The integrated circuit device of claim 12, wherein:

one of said first number, said second number, and said third number of reprogrammable elements are disposed on said intersecting interconnect conductors in a diagonal plus two pattern.

19. The integrated circuit device of claim 12, wherein:

one of said first number, said second number, and said third number of reprogrammable elements are disposed on said intersecting interconnect conductors in a diagonal plus three pattern.

20. The integrated circuit device of claim 12, wherein:

one of said first number, said second number, and said third number of reprogrammable elements are disposed on said intersecting interconnect conductors in a fully populated pattern.

21. The integrated circuit device of claim 12, wherein:

said plurality of lookup tables comprises:
    at least two three-input lookup table; and
    at least one two-input lookup table.

\* \* \* \* \*